United States Patent
Mou et al.

(10) Patent No.: US 11,085,554 B2
(45) Date of Patent: Aug. 10, 2021

(54) MICRO FLUID ACTUATOR

(71) Applicant: Microjet Technology Co., Ltd., Hsinchu (TW)

(72) Inventors: Hao-Jan Mou, Hsinchu (TW); Rong-Ho Yu, Hsinchu (TW); Cheng-Ming Chang, Hsinchu (TW); Hsien-Chung Tai, Hsinchu (TW); Wen-Hsiung Liao, Hsinchu (TW); Chi-Feng Huang, Hsinchu (TW); Yung-Lung Han, Hsinchu (TW); Hsuan-Kai Chen, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 95 days.

(21) Appl. No.: 16/740,839

(22) Filed: Jan. 13, 2020

(65) Prior Publication Data
US 2020/0224791 A1     Jul. 16, 2020

(30) Foreign Application Priority Data

Jan. 15, 2019   (TW) .................................. 108101560

(51) Int. Cl.
*F16K 99/00*      (2006.01)
*B81C 1/00*       (2006.01)

(52) U.S. Cl.
CPC ...... *F16K 99/0048* (2013.01); *B81C 1/00023* (2013.01); *F16K 99/0003* (2013.01); *F16K 2099/0086* (2013.01)

(58) Field of Classification Search
CPC ............. F16K 99/0003; F16K 99/0048; F16K 2099/0086; F04B 43/046
See application file for complete search history.

(56) References Cited

U.S. PATENT DOCUMENTS

| 4,826,131 | A | 5/1989 | Mikkor |
| 2013/0058819 | A1* | 3/2013 | Kodama ............... F04B 43/043 417/479 |
| 2018/0128267 | A1* | 5/2018 | Kawamura ............ A61B 5/022 |

FOREIGN PATENT DOCUMENTS

| CN | 102979705 A | 3/2013 |
| CN | 106926582 A | 7/2017 |
| GB | 2561925 A | 10/2018 |
| JP | 2010-64260 A | 3/2010 |
| TW | 201823145 A | 7/2018 |

* cited by examiner

*Primary Examiner* — Paul J Gray
(74) *Attorney, Agent, or Firm* — Birch, Stewart, Kolasch & Birch, LLP

(57) ABSTRACT

A micro fluid actuator includes a first substrate, a chamber layer, a vibration layer, a first metal layer, a piezoelectric actuation layer, a second metal layer, a second substrate, an inlet layer, a resonance layer and an aperture array plate. The first substrate includes a plurality of first outflow apertures and a plurality of second outflow apertures. The chamber layer includes a storage chamber. The second metal layer includes an upper electrode pad and a lower electrode pad. While driving power having different phase charges is provided to the upper electrode pad and the lower electrode pad to drive and control the vibration layer to displace in a reciprocating manner, the fluid is inhaled from the exterior through the inlet layer, converged to the storage chamber, compressed and pushes out the aperture array plate, and then is discharged out from the micro fluid actuator to achieve fluid transportation.

20 Claims, 33 Drawing Sheets

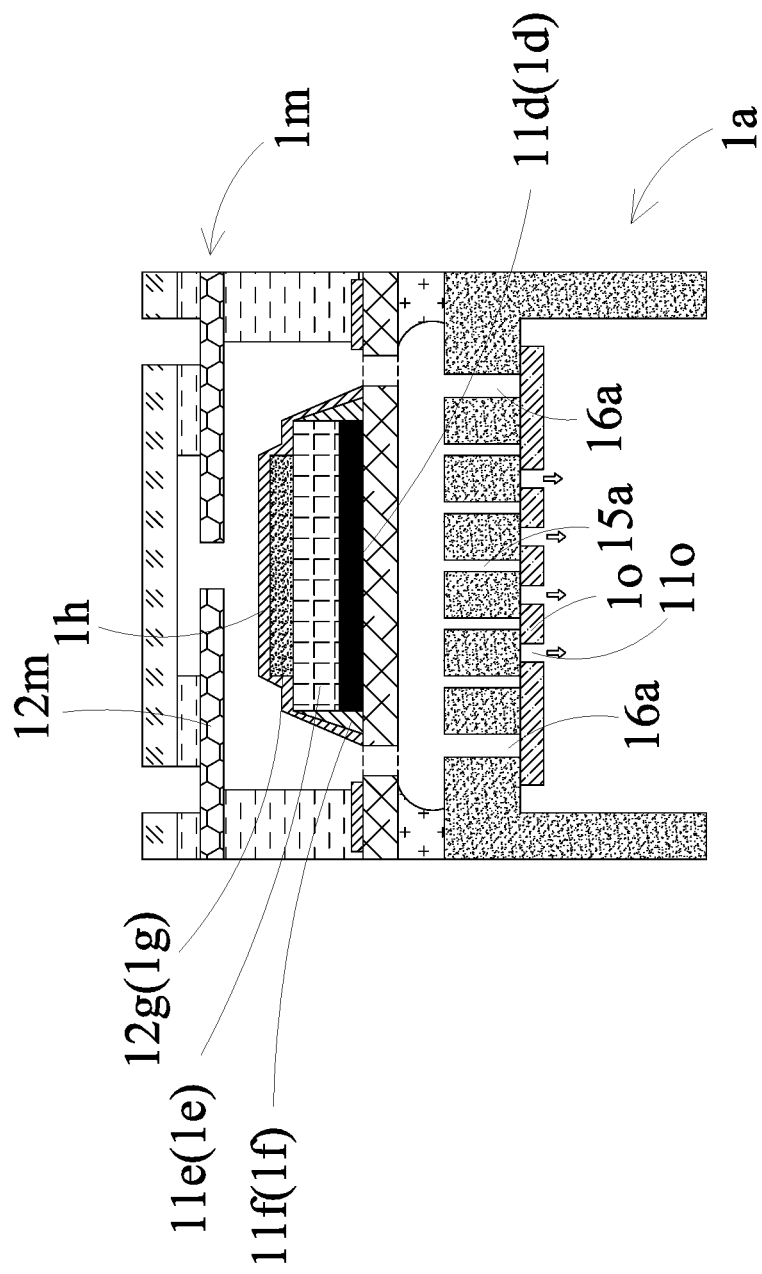

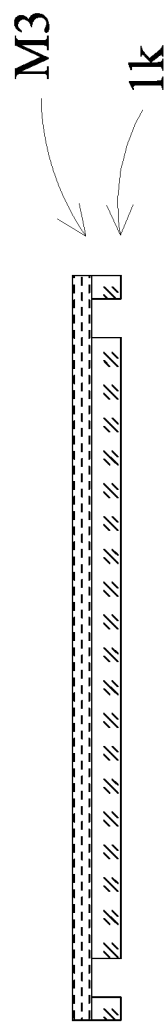
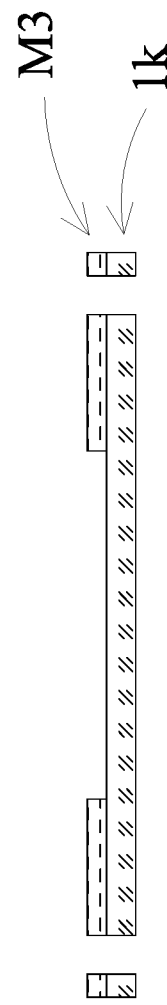
FIG. 9A
FIG. 9B

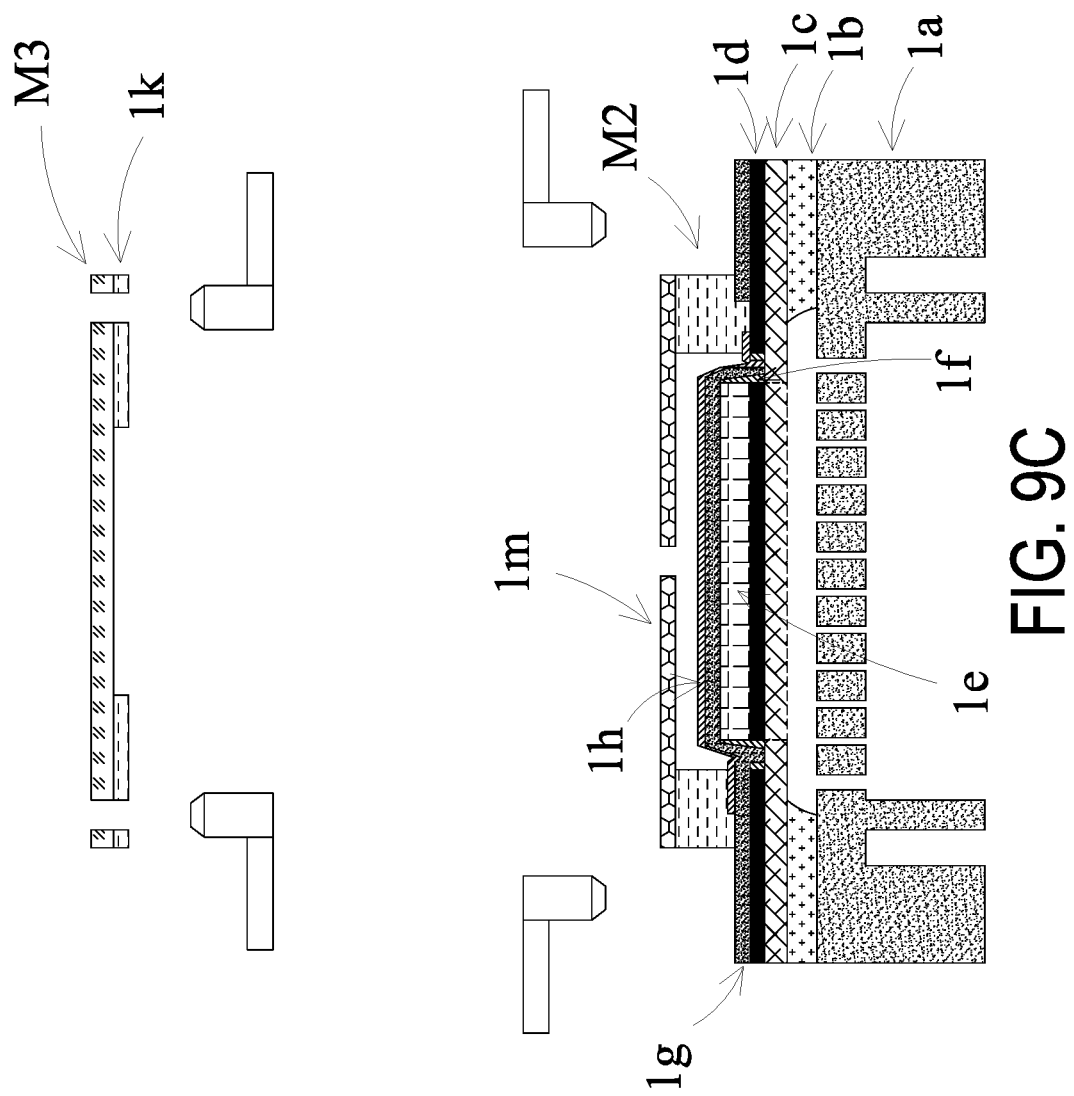

MICRO FLUID ACTUATOR

FIELD OF THE DISCLOSURE

The present disclosure relates to an actuator, and more particularly to a micro fluid actuator manufactured by surface micromachining and bulk micromachining micro-electromechanical processes.

BACKGROUND OF THE DISCLOSURE

Currently, in all fields, such as pharmaceutical industries, computer techniques, printing industries and energy industries, products are developed toward elaboration and miniaturization. The fluid transportation devices that are comprised in, for example, micro pumps, micro atomizers, print heads and industrial printing devices are important components.

With the rapid advance of technology, the application of the fluid transportation devices tends to be more and more diversified. For example, the industrial applications, the biomedical applications, the healthcare, the electronic cooling and so on, even the wearable devices, which are popular recently, the fluid transportation devices are utilized therein. It is obviously that the conventional fluid transportation devices gradually tend to miniaturize the structure and maximize the flow rate thereof.

In the prior art, various kinds of miniaturized fluid actuator manufactured by micro-electromechanical system (MEMS) process has been developed. However, to improve the efficiency of fluid transportation through innovative structure still is the important part of development.

SUMMARY OF THE DISCLOSURE

The object of the present disclosure is to provide a valve-equipped micro fluid actuator manufactured by micro-electromechanical system process and capable of transporting fluid. The micro fluid actuator of the present disclosure is manufactured by surface micromachining and bulk micromachining micro-electromechanical processes with packaging technology.

In accordance with an aspect of the present disclosure, a micro fluid actuator is provided. The micro fluid actuator includes a substrate, a chamber layer, a vibration layer, a first metal layer, a piezoelectric actuation layer, a separation layer, a second metal layer, a waterproof layer, a photoresist layer, an inlet layer, a fluid channel layer, a resonance layer and an aperture array plate. The substrate has a first surface, a second surface, an outlet groove, a plurality of first outflow apertures and a plurality of second outflow apertures, wherein the outlet groove, the plurality of first outflow apertures and the plurality of second outflow apertures are formed by an etching process, the outlet groove is in fluid communication with the plurality of first outflow apertures and the plurality of second outflow apertures, and the plurality of second outflow apertures are disposed on outer side of the plurality of first outflow apertures. The chamber layer is formed on the first surface of the substrate by a deposition process, and is etched to form a storage chamber, wherein the storage chamber is in fluid communication with the plurality of first outflow apertures and the plurality of second outflow apertures. The vibration layer is formed on the chamber layer by the deposition process, and is etched to form a plurality of fluid grooves and a vibration region, wherein the plurality of fluid grooves are symmetrically formed on two opposite sides of the vibration layer, and the vibration region is thereby defined. The first metal layer is formed on the vibration layer by the deposition process, and is etched to form a lower electrode region, a plurality of barrier regions and a plurality of gaps, wherein the lower electrode region is formed correspondingly in position to the vibration region, the plurality of gaps are formed between the lower electrode region and the plurality of barrier regions, and the plurality of barrier regions are formed corresponding in outside positions to the plurality of fluid grooves. The piezoelectric actuation layer is formed on the first metal layer by the deposition process, and is etched to form an actuation region corresponding in position to the lower electrode region of the first metal layer. The separation layer is formed on the piezoelectric actuation layer and the first metal layer by the deposition process, and is etched to form a plurality of gap walls within the plurality of gaps. The second metal layer is formed on the piezoelectric actuation layer, the first metal layer and the separation layer by the deposition process, and is etched to form an upper electrode pad and a lower electrode pad on the first metal layer. The waterproof layer is formed on the first metal layer, the second metal layer and the separation layer by a coating process, and is etched to expose the upper electrode pad and the lower electrode pad. The photoresist layer is formed on the first metal layer, the second metal layer and the waterproof layer by a photolithography process. The inlet layer forms a plurality of fluid inlets thereon by the etching process or a laser process. The fluid channel layer is formed on the inlet layer, and is etched to form an inflow chamber, a plurality of inflow channels and a plurality of fluid channel inlets by the photolithography process, wherein the plurality of fluid channel inlets are respectively in fluid communication with the plurality of fluid inlets of the inlet layer, the plurality of inflow channels and the plurality of fluid channel inlets are disposed around the surrounding of the inflow chamber, and the plurality of inflow channels are in fluid communication between the plurality of fluid channel inlets and the inflow chamber. The resonance layer is formed on the fluid channel layer by a rolling process, forms a chamber through hole thereon by the etching process, and the resonance layer joins the photoresist layer by a flip alignment process and a wafer bonding process. The aperture array plate is formed on the substrate by a sticking process and comprises a plurality of aperture plate through holes, wherein the plurality of aperture plate through holes are misaligned with the plurality of first outflow apertures and the plurality of second outflow apertures, thereby sealing the plurality of first outflow apertures and the plurality of second outflow aperture of the substrate. Wherein as driving power having different phase charges is provided to the upper electrode pad and the lower electrode pad to drive and control the vibration region of the vibration layer to displace in a reciprocating manner, the fluid is inhaled from the plurality of fluid inlets, flows into the inflow chamber through the plurality of inflow channels, flows into the resonance chamber through the chamber through hole, flows into the storage chamber through the plurality of fluid grooves, is compressed to flow through the plurality of first outflow apertures and the plurality of second outflow apertures, pushes out the aperture array plate, and then is discharged out from the plurality of aperture plate through holes to achieve fluid transportation.

The above contents of the present disclosure will become more readily apparent to those ordinarily skilled in the art

BRIEF DESCRIPTION OF THE DRAWINGS

FIGS. 6A to 6E are schematic views illustrating an actuation of the micro fluid actuator according to the first embodiment of the present disclosure;

FIGS. 9A to 9C are schematic views illustrating a flip alignment process and a wafer bonding process according to a fourth embodiment of the present disclosure.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1A:
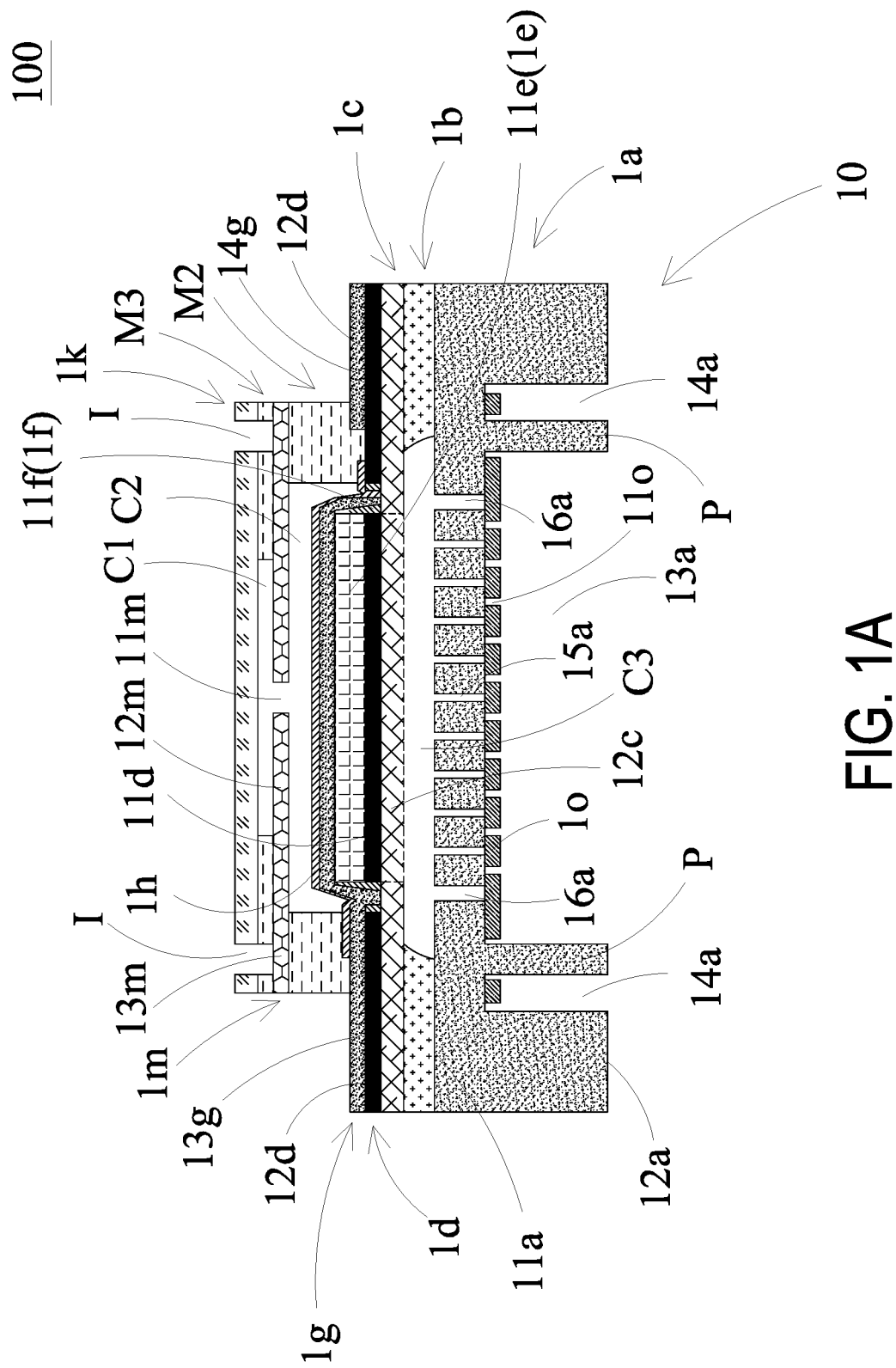
FIG. 1A is a cross sectional view illustrating a micro fluid actuator according to a first embodiment of the present disclosure from a first view angle.
Figure 1B:
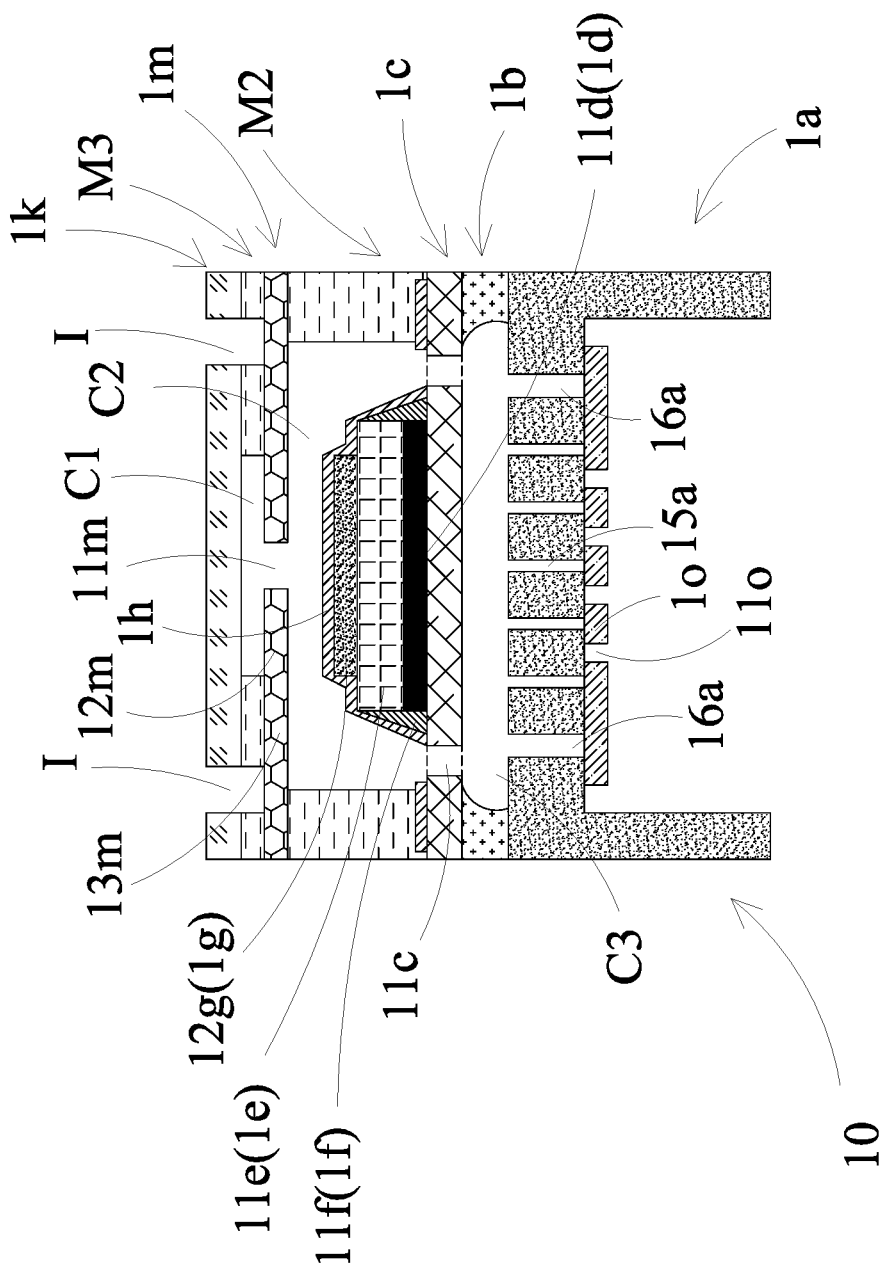
FIG. 1B is a cross sectional view illustrating the micro fluid actuator according to the first embodiment of the present disclosure from a second view angle.

Please refer to the FIGS. 1A and 1B, the micro fluid actuator of the present application is used for fluid transportation. In some embodiments, the micro fluid actuator 100 includes a first substrate 1a, a chamber layer 1b, a vibration layer 1c, a first metal layer 1d, a piezoelectric actuation layer 1e, a separation layer 1f, a second metal layer 1g, a waterproof layer 1h, a second substrate 1i, a thin film adhesive layer 1j, an inlet layer 1k, a resonance layer 1m, a mask layer 1n, an aperture array plate 1o, a first photoresist layer M1, a second photoresist layer M2, a fluid channel layer M3 and a third photoresist layer M4. The aperture array plate 1o, the first substrate 1a, the chamber layer 1b, the vibration layer 1c, the first metal layer 1d, the piezoelectric actuation layer 1e, the separation layer 1f, the second metal layer 1g, the waterproof layer 1h, the second photoresist layer M2, the resonance layer 1m, the fluid channel layer M3 and the inlet layer 1k are sequentially stacked into one piece, and the manufacturing process is explained as follows. In the first embodiment of the present disclosure, the micro fluid actuator 100 includes an actuation unit 10.

Figure 2A:
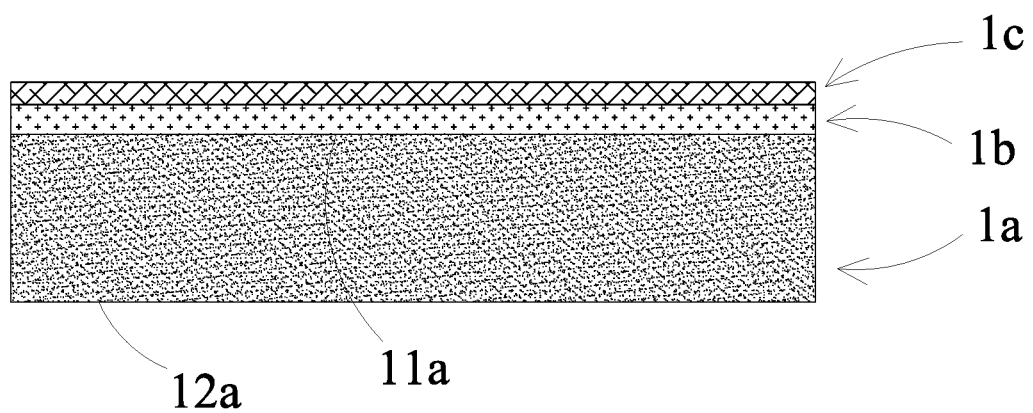
FIGS. 2A to 2AH are cross sectional views illustrating a manufacturing process of the micro fluid actuator according to the first embodiment of the present disclosure.

Please refer to FIG. 2A. In the first embodiment of the present disclosure, the first substrate 1a is made of silicon material. The first substrate 1a has a first surface 11a and a second surface 12a opposite to the first surface 11a. In the first embodiment of the present disclosure, the chamber layer 1b is formed on the first surface 11a of the first substrate 1a by a deposition process of silicon dioxide material. The deposition process is at least one selected from the group consisting of physical vapor deposition (PVD), chemical vapor deposition (CVD) and a combination thereof, but the present disclosure is not limited thereto. In the first embodiment of the present disclosure, the vibration layer 1c is formed on the chamber layer 1b by a deposition process that deposits silicon mononitride material.

Figure 2B:
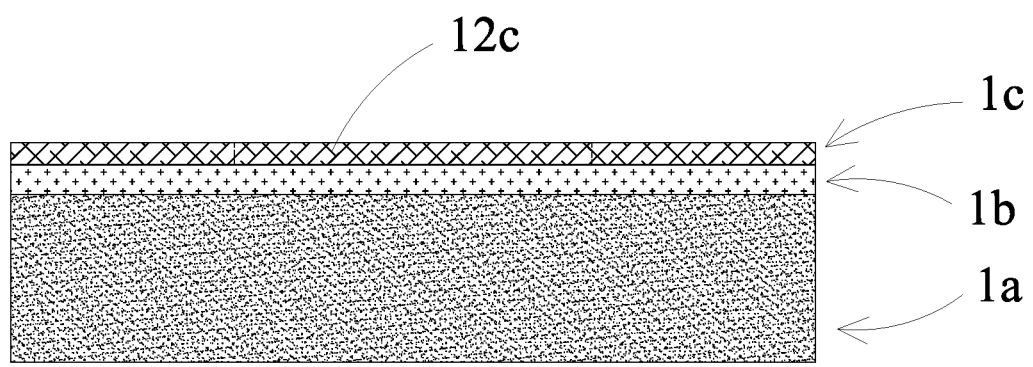
Figure 3:
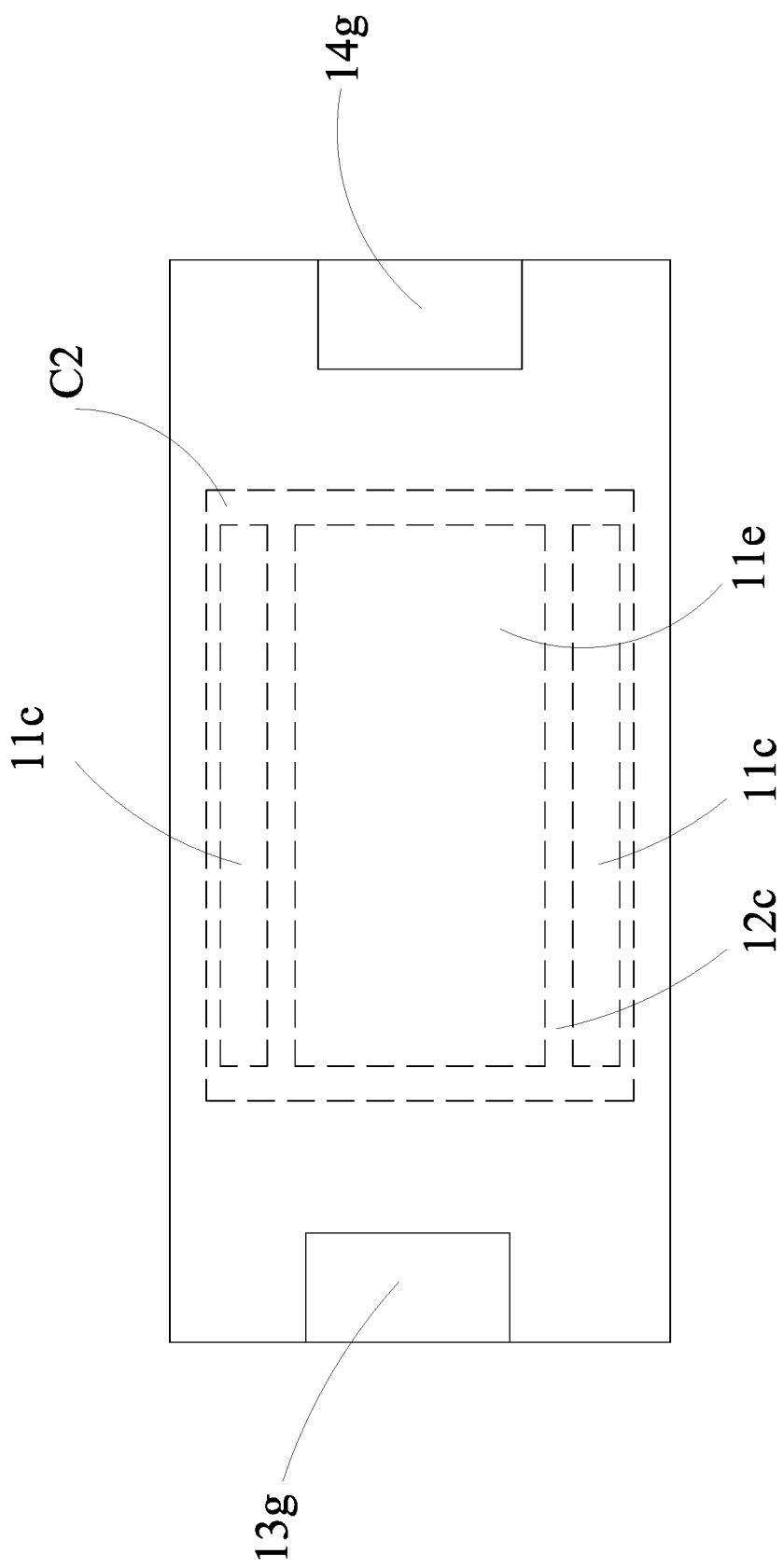
FIG. 3 is a top schematic view illustrating the micro fluid actuator according to the first embodiment of the present disclosure.

Please refer to FIGS. 2B and 3. In the first embodiment of the present disclosure, a plurality of fluid grooves 11c and a vibration region 12c are formed on the vibration layer 1c by an etching process. The plurality of fluid grooves 11c are symmetrically formed on two opposite sides of the vibration layer 1c and the vibration region 12c is thereby defined. It is noted that, in the first embodiment of the present disclosure, the etching process is at least one selected from the group consisting of wet etching, dry etching and a combination thereof, but the present disclosure is not limited thereto. It is noted that in the first embodiment of the present disclosure, the vibration layer 1c includes two fluid grooves 11c respectively formed on the two opposite sides of the vibration layer 1c in the longitudinal direction, but the present disclosure is not limited thereto.

Figure 2C:
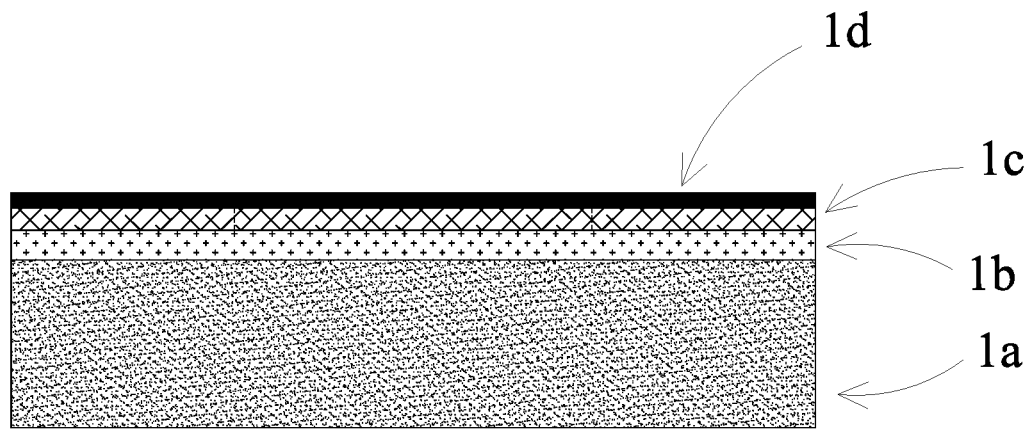
Figure 2D:
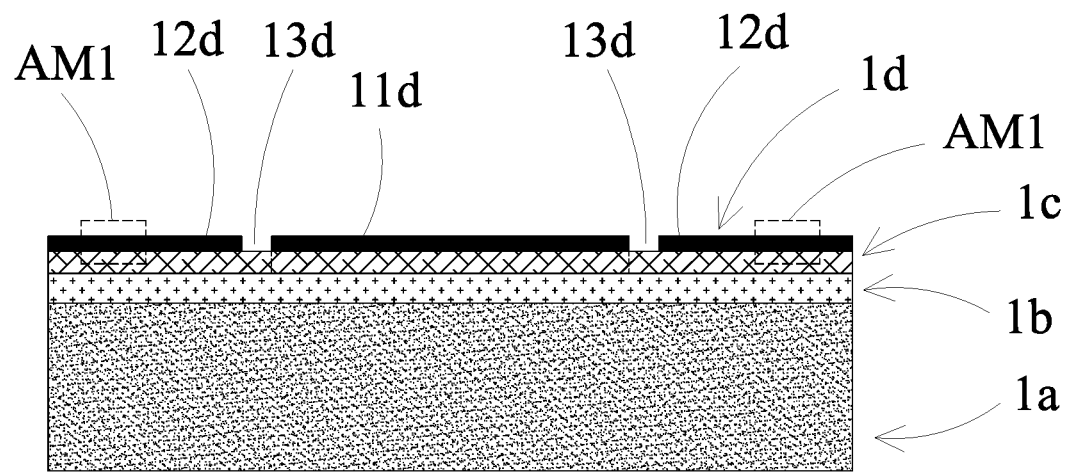

Please refer to FIGS. 2C and 2D. In the first embodiment of the present disclosure, the first metal layer 1d is formed on the vibration layer 1c by a deposition process that deposits a first metal material. In some embodiments, the first metal material is titanium nitride material or tantalum material, but is not limited thereto. A lower electrode region 11d, a plurality of barrier regions 12d, a plurality of gaps 13d and a plurality of first engagement alignment marks AM1 are formed on the first metal layer 1d by an etching process. The lower electrode region 11d is formed correspondingly in position to the vibration region 12c of the vibration layer 1c. The plurality of gaps 13d are formed between the lower electrode region 11d and the plurality of barrier regions 12d. The plurality of barrier regions 12d are formed correspondingly in positions to outside of the plurality of fluid grooves 11c of the vibration layer 1c. The plurality of first engagement alignment marks AM1 are formed on the plurality of barrier regions 12d.

Figure 2E:
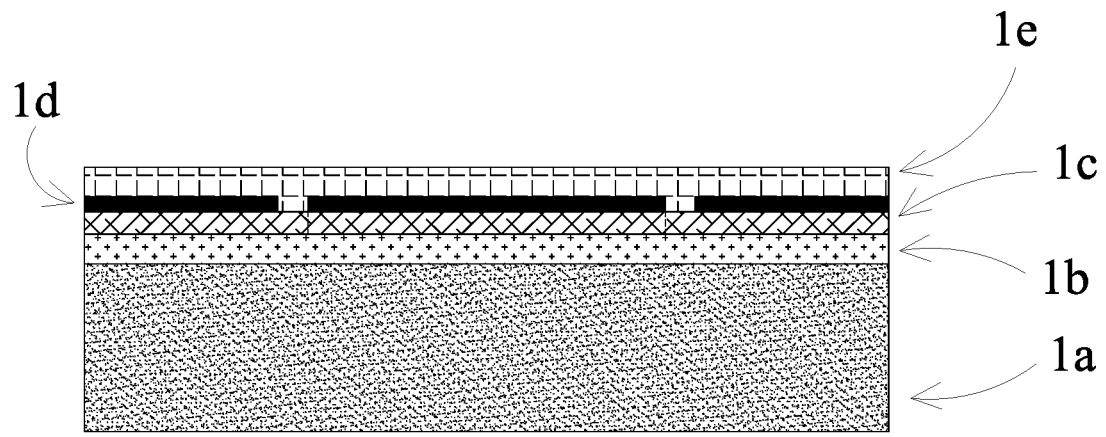
Figure 2F:
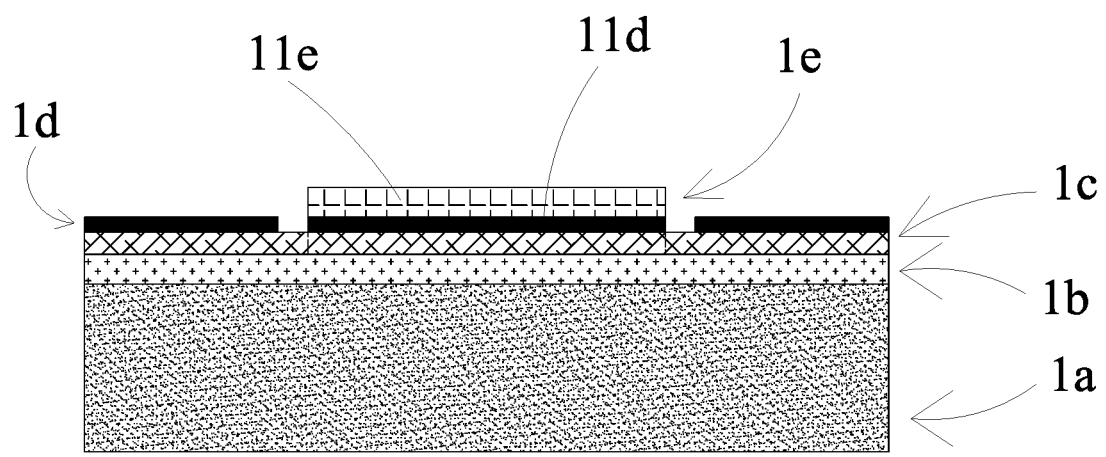

Please refer to FIGS. 2E and 2F. In the first embodiment of the present disclosure, the piezoelectric actuation layer 1e is formed on the first metal layer 1d by a deposition process that deposits piezoelectric material, and an actuation region 11e is formed correspondingly in position to the lower electrode region 11d of the first metal layer 1d by an etching process.

Figure 2G:
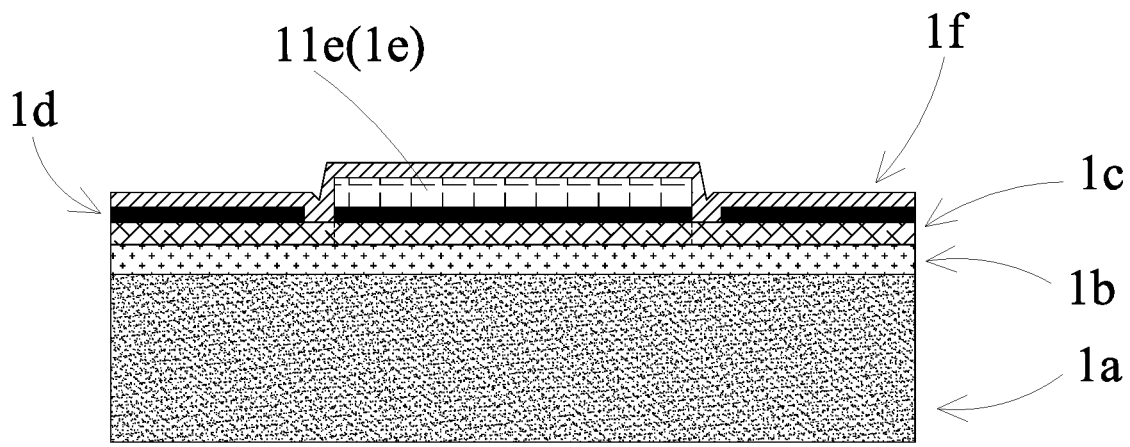
Figure 2H:
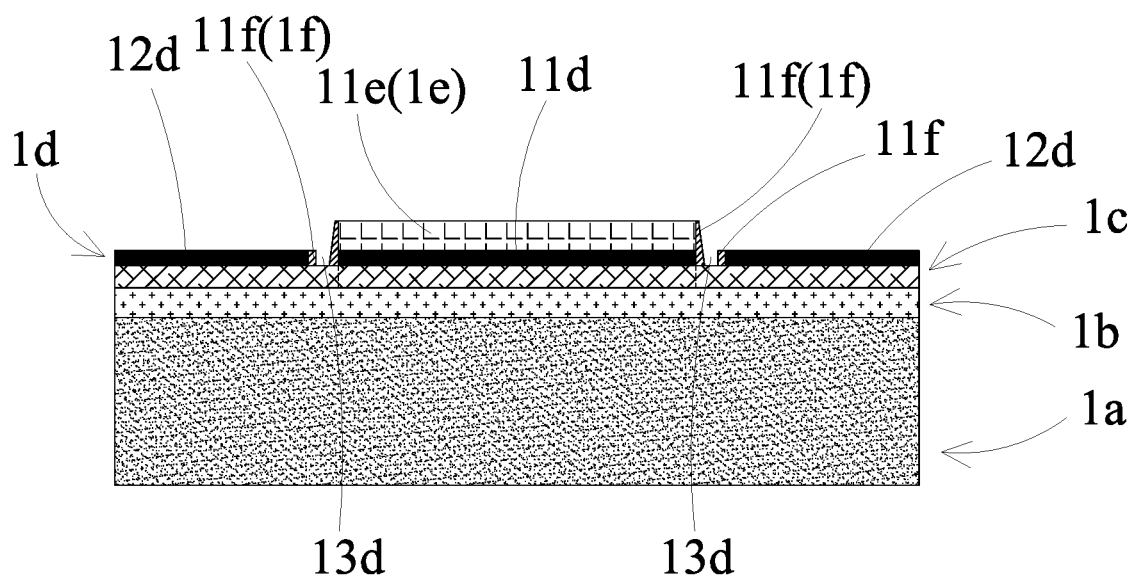

Please refer to FIGS. 2G and 2H. In the first embodiment of the present disclosure, the separation layer 1f is formed on the first metal layer 1d and the piezoelectric actuation layer 1e by a deposition process that deposits silicon dioxide material, and a plurality of gap walls 11f are formed within the plurality of gaps 13d of the first metal layer 1d by an etching process.

Figure 2I:
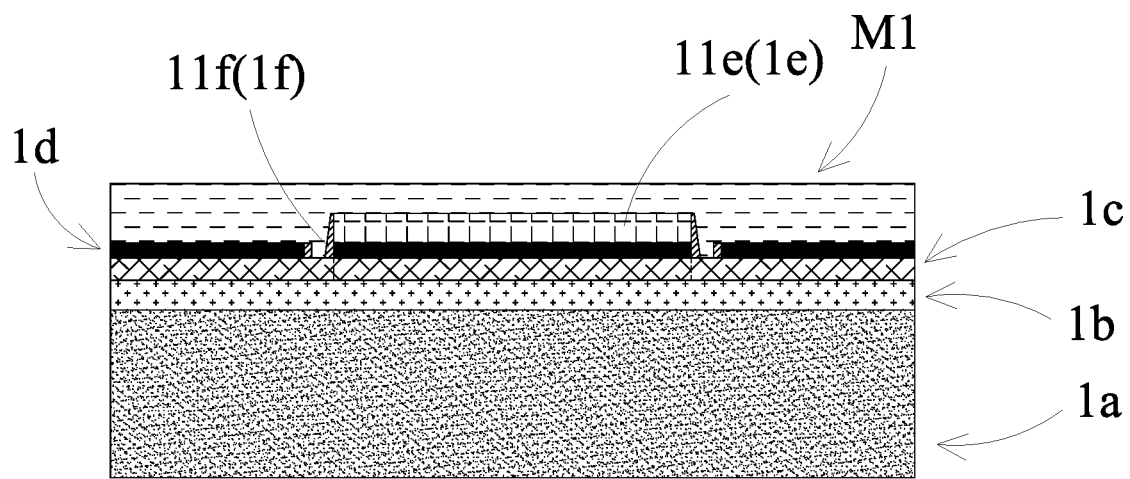
Figure 2J:
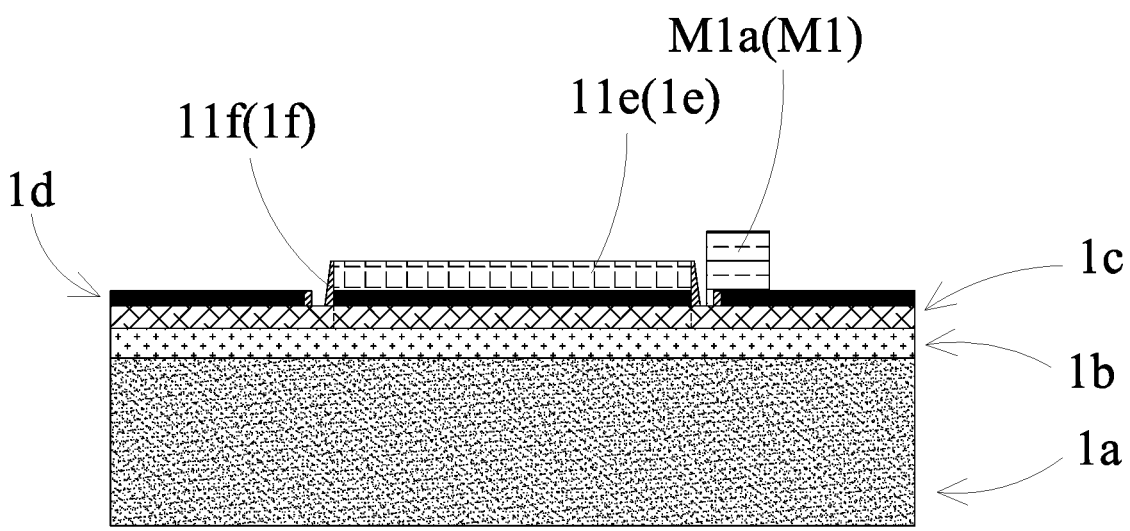

Please refer to FIGS. 2I and 2J. In the first embodiment of the present disclosure, the first photoresist layer M1 is formed on the first metal layer 1d, the piezoelectric actuation layer 1e and the separation layer 1f by a photoresist coating process. After the first photoresist layer M1 is developed, a first photoresist region M1a is formed. It is noted that, the photoresist coating process is spin coating or laminate rolling, but the present disclosure is not limited thereto, and it can be varied according to the practical requirements of the manufacturing process. In the first embodiment of the present disclosure, the first photoresist layer M1 is used as a negative photoresist, but the present disclosure is not limited thereto.

Figure 2K:
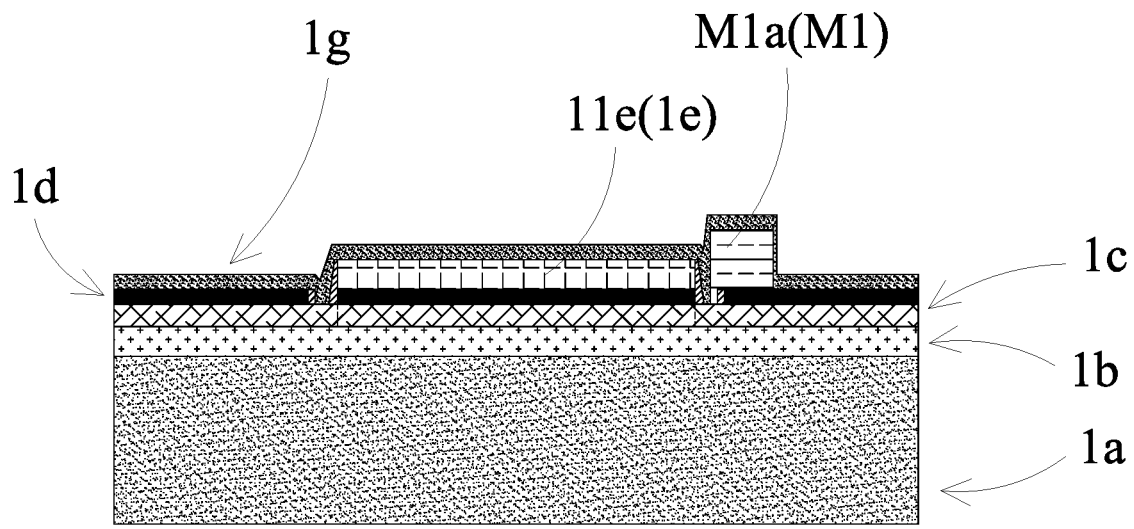
Figure 2L:
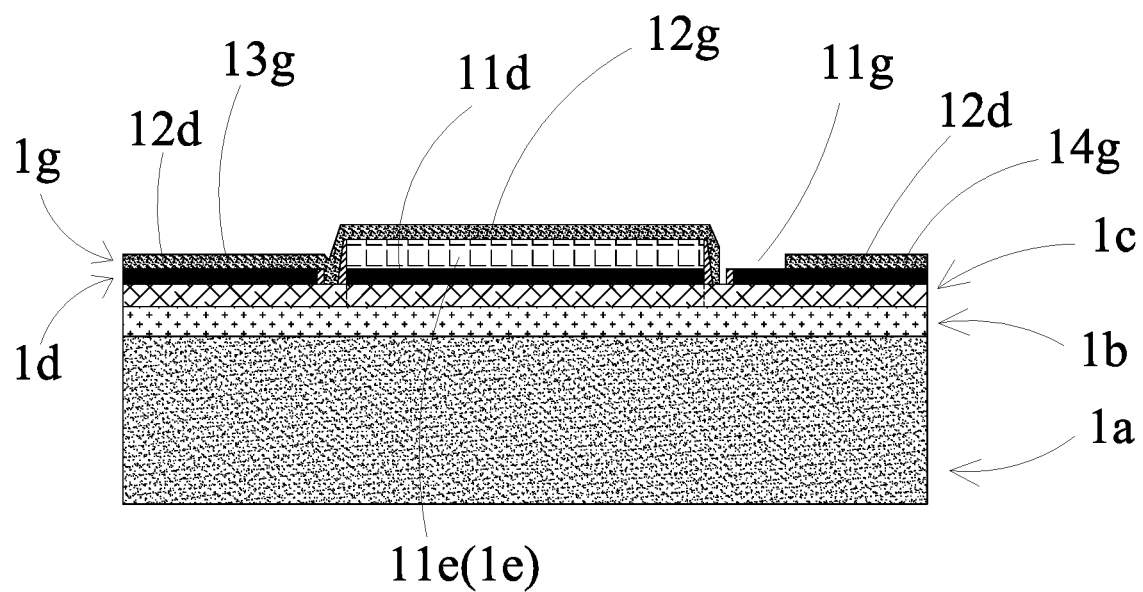

Please refer to FIGS. 2K, 2L and 3. In the first embodiment of the present disclosure, the second metal layer 1g is formed on the first metal layer 1d, the piezoelectric actuation layer 1e, the separation layer 1f and the first photoresist region M1a of the first photoresist layer M1 by a deposition process that deposits a second metal material. In the first embodiment of the present disclosure, the second metal material is gold material or aluminum material, but the present disclosure is not limited thereto. A lift-off process is performed to the second metal layer 1g to remove the first photoresist layer M1, and thereby a pad separation region 11g, an upper electrode region 12g, an upper electrode pad 13g and a lower electrode pad 14g are formed. The upper electrode region 12g is formed on the actuation region 11e of the piezoelectric actuation layer 1e. The upper electrode pad 13g and the lower electrode pad 14g are formed on the first metal layer 1d and are located on two opposite sides of the actuation region 11e of the piezoelectric actuation layer 1e. The upper electrode region 12g and the lower electrode pad 14g are separated by the pad separation region 11g.

Figure 2M:
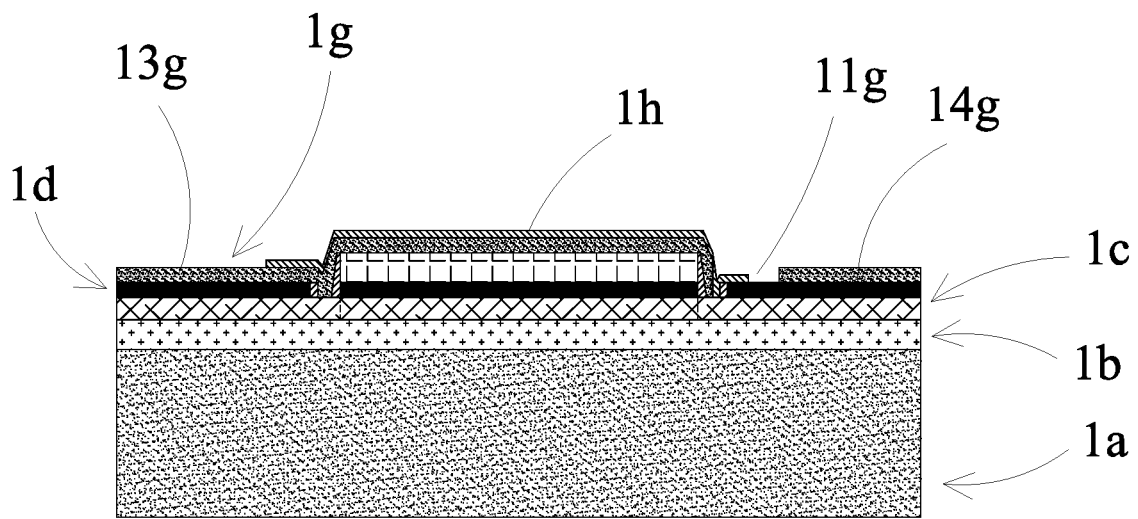

Please refer to FIG. 2M. In the first embodiment of the present disclosure, the waterproof layer 1h is formed on the first metal layer 1d, the second metal layer 1g and the separation layer 1f by a coating process, and the upper electrode pad 13g and the lower electrode pad 14g of the second metal layer 1g are exposed by an etching process thereafter. It is noted that, in the first embodiment of the present disclosure, the waterproof layer 1h is made of parylene material, but the present disclosure is not limited thereto. The coating process of the parylene material can be performed under room temperature, and the parylene material has advantages of good covering ability, high chemical resistance and good biocompatibility, etc. It is noted that by the arrangement of the waterproof layer 1h, the short circuit phenomena caused by the fluid corrosions of the first metal layer 1d, piezoelectric actuation layer 1e and the second metal layer 1g can be prevented.

Figure 2N:
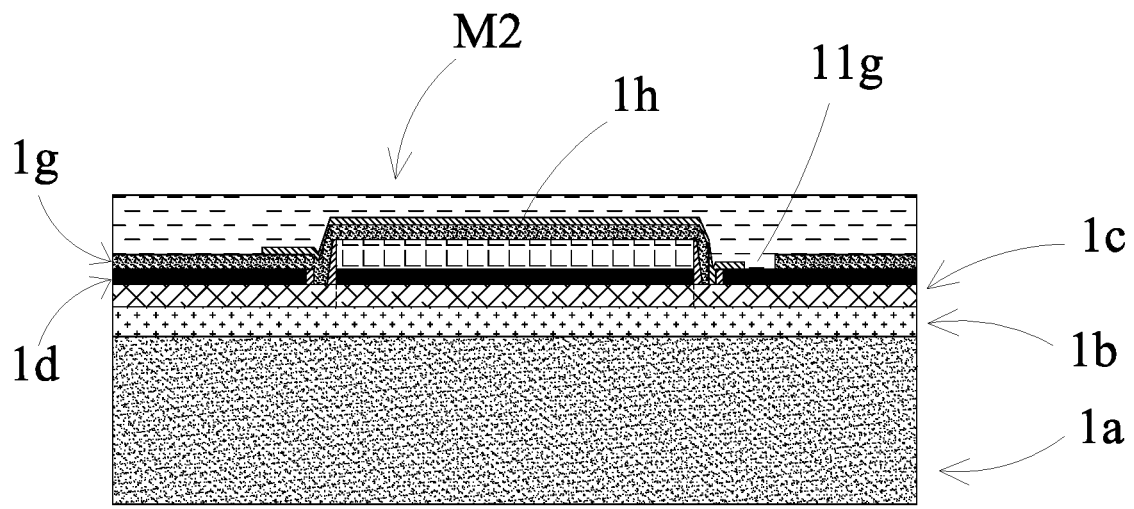
Figure 2O:
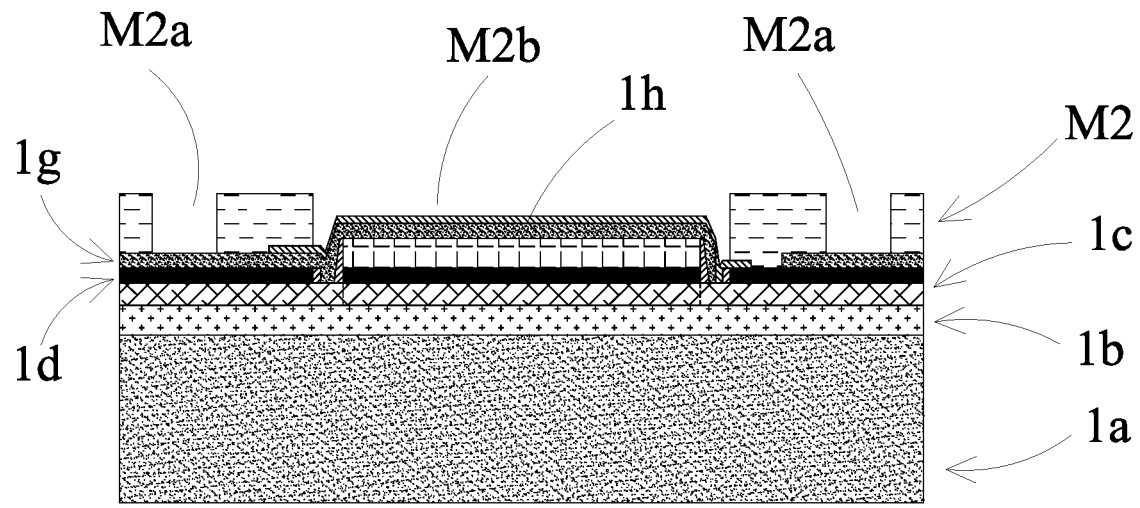

Please refer to FIGS. 2N and 2O. In the first embodiment of the present disclosure, the second photoresist layer M2 is formed on the first metal layer 1d, the second metal layer 1g and the waterproof layer 1h by a photoresist coating process. After the second photoresist layer M2 is developed, a plurality of second photoresist apertures M2a and a second photoresist opening M2b are formed.

Figure 2P:
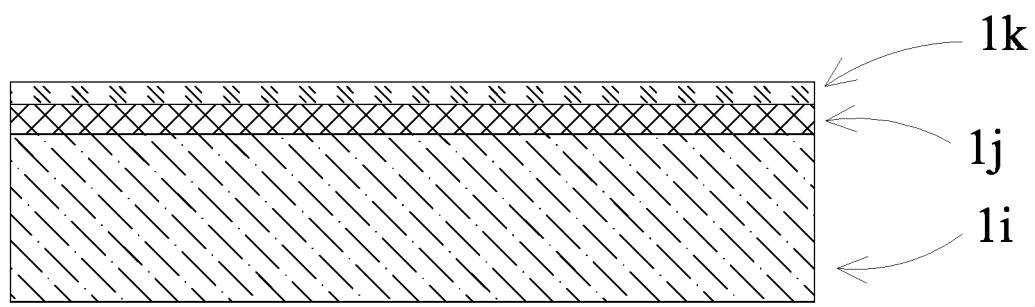
Figure 2Q:
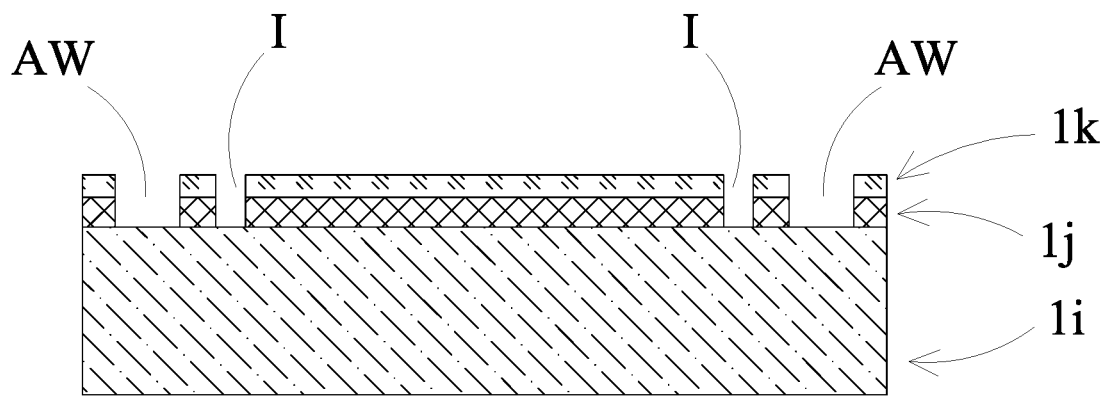
Figure 4:
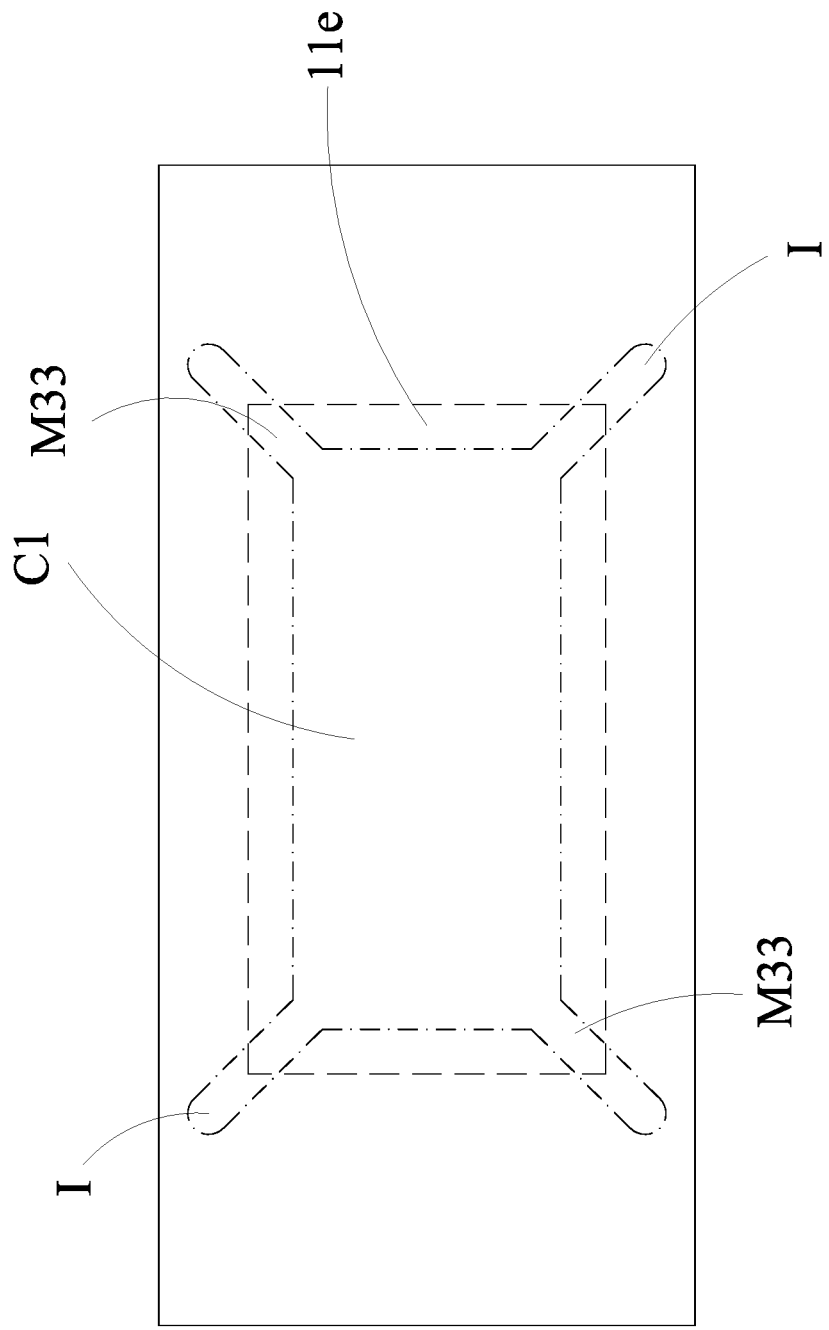
FIG. 4 is a bottom schematic view illustrating the inlet layer according to the first embodiment of the present disclosure.
Figure 5:
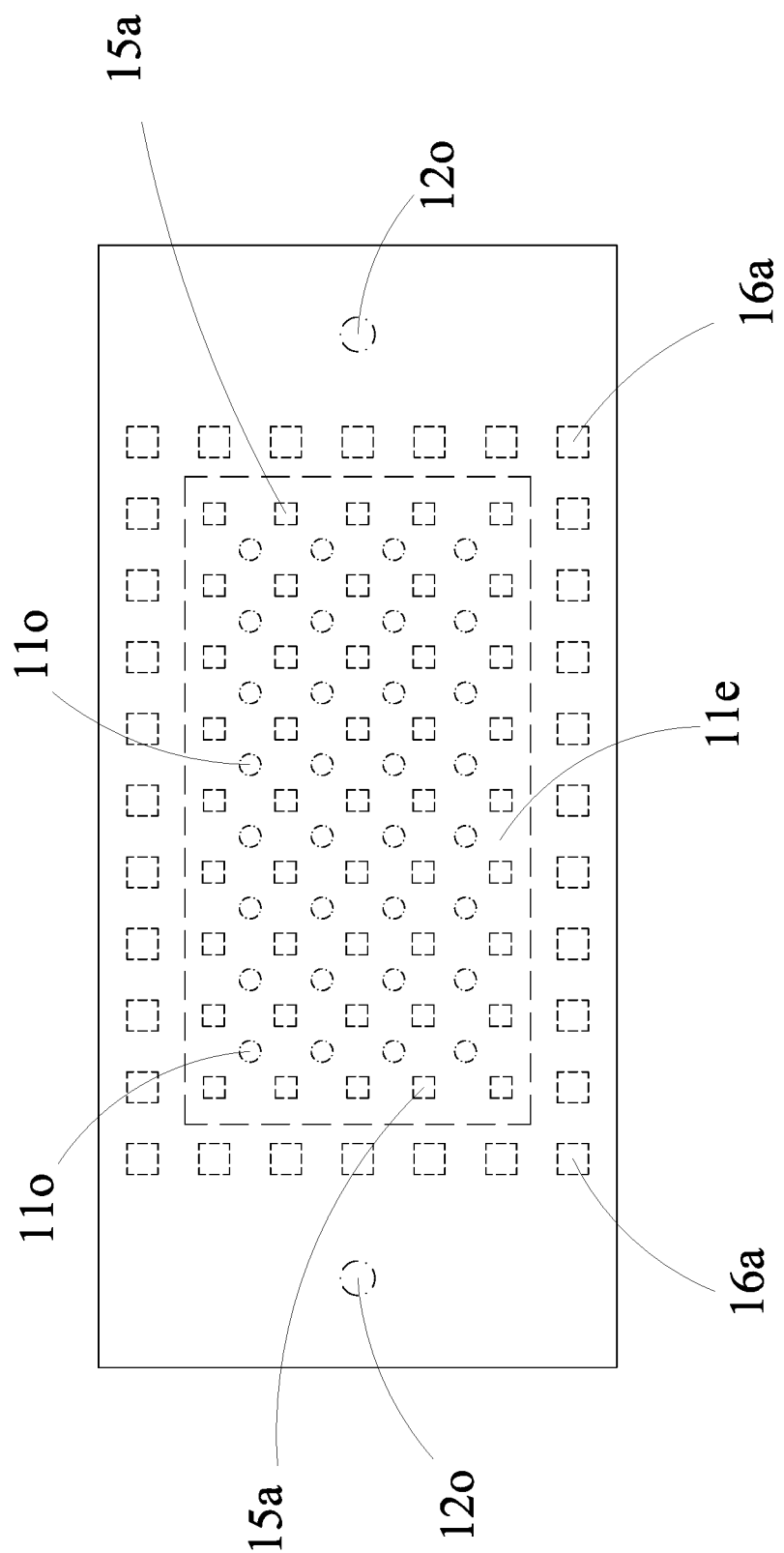
FIG. 5 is a bottom schematic view illustrating the aperture array plate according to the first embodiment of the present disclosure.

Please refer to FIGS. 2P, 2Q and 4. In the first embodiment of the present disclosure, the second substrate 1i is a glass substrate. The thin film adhesive layer 1j is formed on the second substrate 1i by a rolling process. The inlet layer 1k is formed on the thin film adhesive layer 1j by a rolling process. In the first embodiment of the present disclosure, the inlet layer 1k is made of polyimide (PI) material, but the present disclosure is not limited thereto. An etching process is performed to the thin film adhesive layer 1j and the inlet layer 1k so that a plurality of fluid inlets I and a plurality of engagement alignment mark windows AW are formed. The plurality of engagement alignment mark windows AW are formed outside of the plurality of fluid inlets I. It is noted that, the etching process that forms the plurality of fluid inlets I and the engagement alignment mark windows AW is dry etching or laser etching, but the present disclosure is not limited thereto. In the first embodiment of the present disclosure, the micro fluid actuator 100 includes four fluid inlets I respectively disposed on the four corners of the micro fluid actuator 100. In some embodiments, the number and the distribution of the fluid inlet I can be varied according to the practical requirements of design.

Figure 2R:
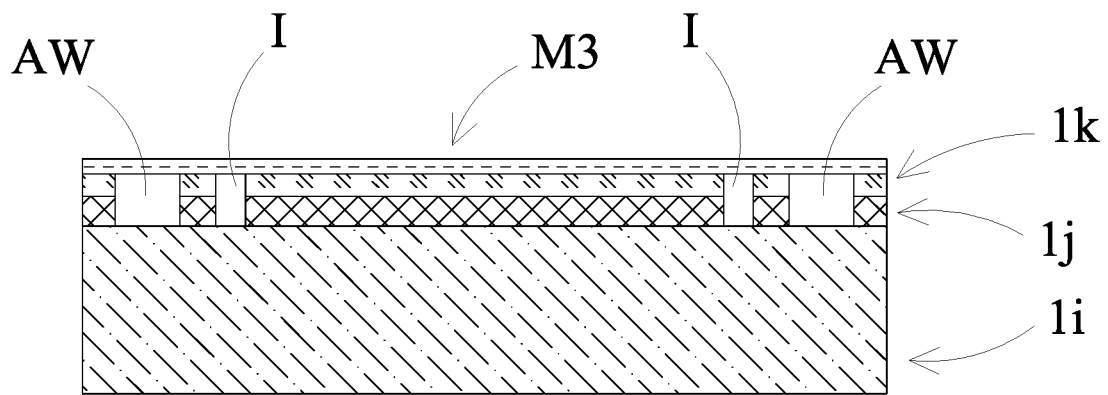
Figure 2S:
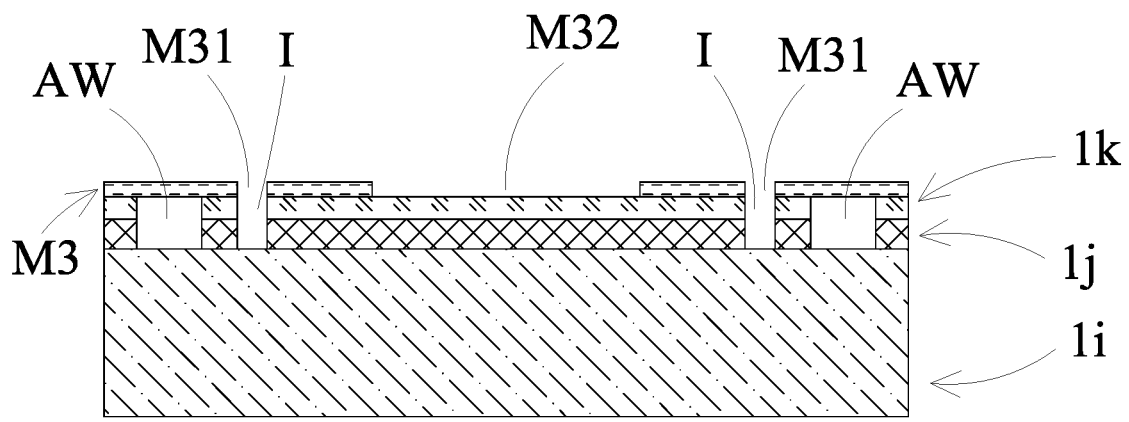

Please refer to FIGS. 2R, 2S and 4. In the first embodiment of the present disclosure, the fluid channel layer M3 is formed on the inlet layer 1k by a photoresist coating process. After the fluid channel layer M3 is developed, a plurality of fluid channel inlets M31, a chamber opening M32 and a plurality of inflow channels M33 are formed. The plurality of fluid channel inlets M31 are respectively in fluid communication with the plurality of fluid inlets I of the inlet layer 1k. The plurality of fluid channel inlets M31 and the plurality of inflow channels M33 are disposed around the surrounding of the chamber opening M32. The plurality of inflow channels M33 are in fluid communication and disposed between the plurality of fluid channel inlets M31 and the chamber opening M32. In the first embodiment of the present disclosure, the fluid channel layer M3 includes four fluid channel inlets M31 and four inflow channels M33. In some embodiments, the number of fluid channel inlet M31 and the inflow channel M33 can be varied according to the practical requirements of design. In the first embodiment of the present disclosure, the fluid channel layer M3 is a thick-film photoresist, but the present disclosure is not limited thereto.

Figure 2T:
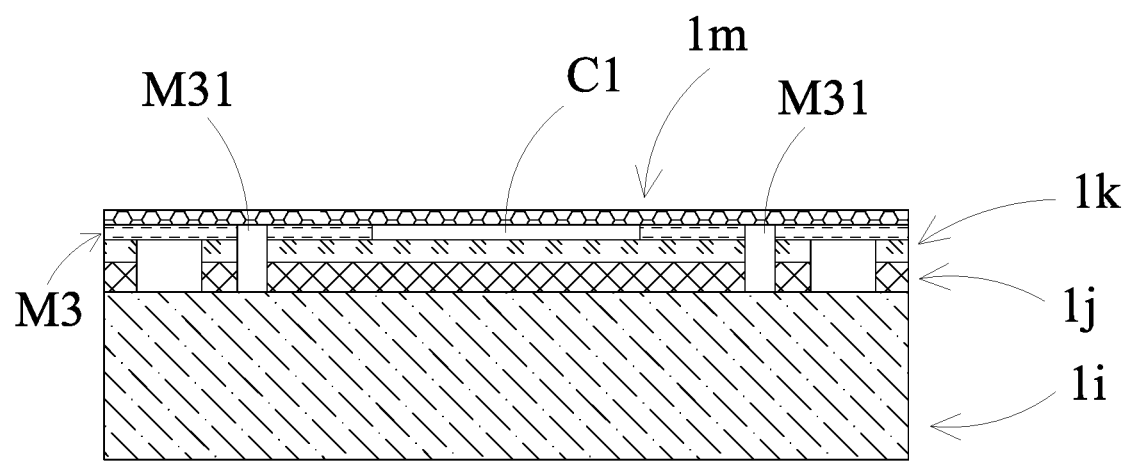
Figure 2U:
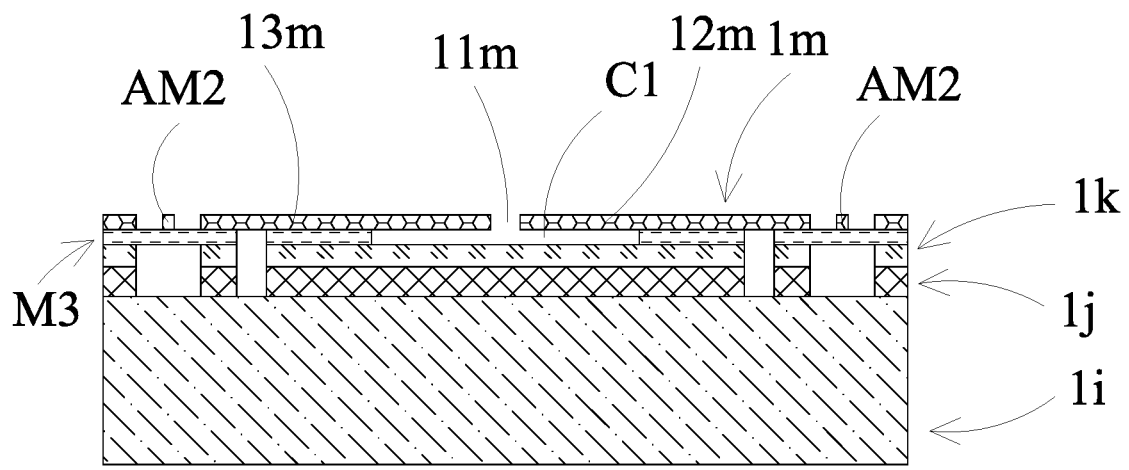

Please refer to FIGS. 2T and 2U. In the first embodiment of the present disclosure, the resonance layer 1m is formed on the fluid channel layer M3 by a rolling process, and a chamber through hole 11m and a plurality of second engagement alignment marks AM2 are formed by an etching process. The resonance layer 1m covers the chamber opening M32 of the fluid channel layer M3 so that an inflow chamber C1 is defined. The chamber through hole 11m is in fluid communication with the inflow chamber C1 of the fluid channel layer M3. The plurality of second engagement alignment marks AM2 are formed on outer side of the resonance layer 1m. Parts of the resonance layer 1m extended out from the chamber through hole 11m to the outer edge of the inflow chamber C1 are defined as movable portions 12m. Parts of the resonance layer 1m extended out from the movable portion 12m to the plurality of second engagement alignment marks AM2 are defined as fixed portions 13m. It is noted that the etching process that forms the resonance layer 1m is dry etching or laser etching, but the present disclosure is not limited thereto.

Figure 2V:
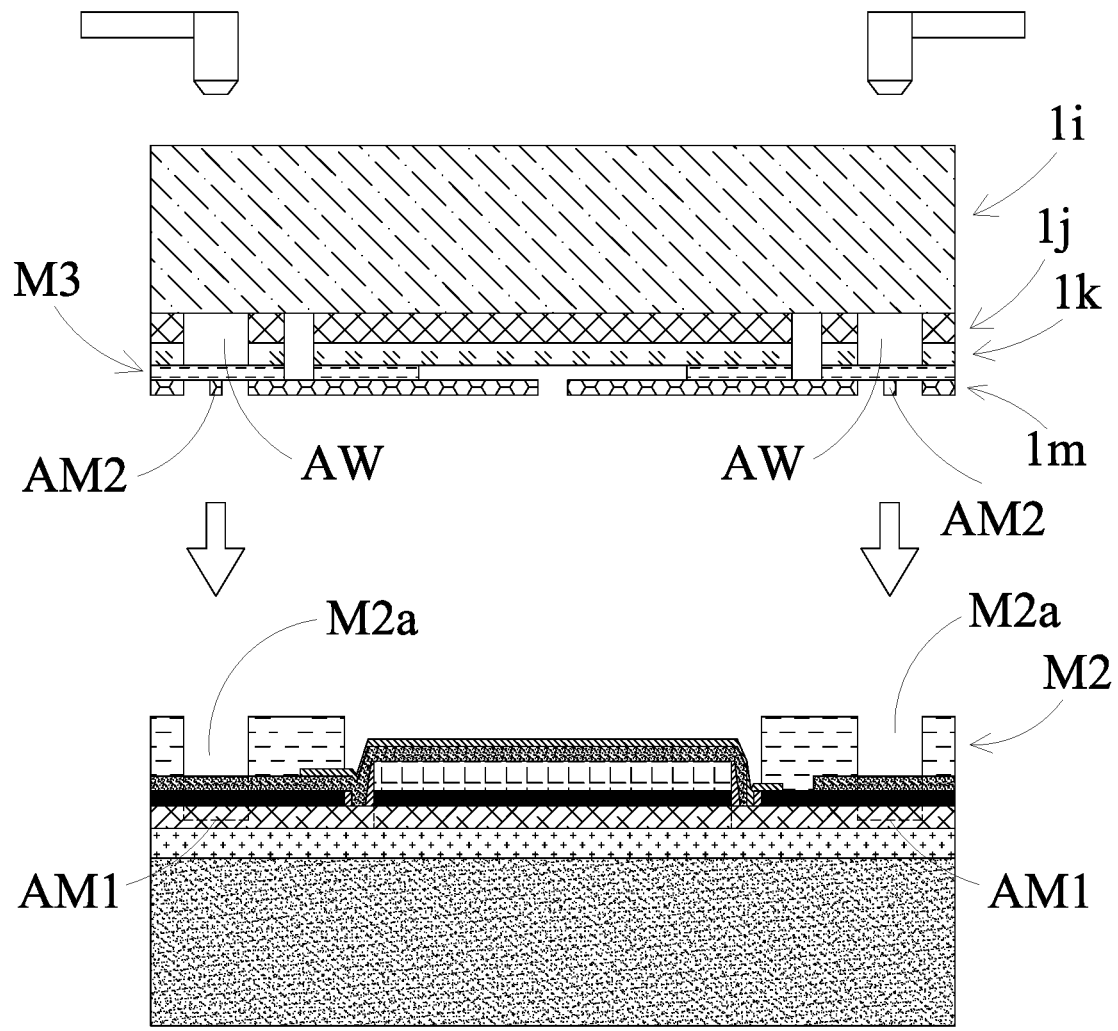

Please refer to FIG. 2V. In the first embodiment of the present disclosure, the resonance layer 1m joins the second photoresist layer M2 by a flip alignment process and a wafer bonding process. In the flip alignment process, the plurality of engagement alignment mark windows AW are utilized for aligning the corresponding first engagement alignment marks AM1 with the plurality of corresponding second engagement alignment marks AM2, by which the alignment process is performed. It is noted that, in the first embodiment of the present disclosure, because of the transparencies of the fluid channel layer M3 and the second substrate 1i, a top-side transparent alignment method can be utilized during the flip alignment process to perform a manual alignment, and the required alignment accuracy is ±10 μm. In the first embodiment of the present disclosure, the resonance layer 1m is made of polyimide (PI) material, but the present disclosure is not limited thereto.

Figure 2W:
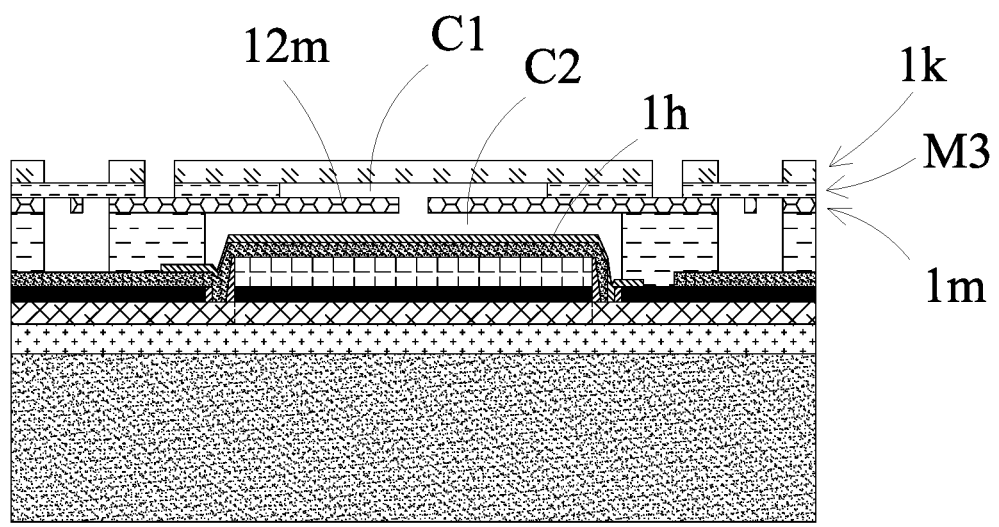

Please refer to FIG. 2W. In the first embodiment of the present disclosure, the thin film adhesive layer 1j on the second substrate 1i is soaked in a solvent to let the stickiness thereof disappear, and the thin film adhesive layer 1j is thereby removed. It is noted that, in the first embodiment of the present disclosure, the required time of soaking the thin film adhesive layer 1j is very short, and the material properties of the thin film adhesive layer 1j are distinct from that of the fluid channel layer M3. Consequently, the solvent does not react with the fluid channel layer M3 and a swelling problem does not occur.

Figure 2X:
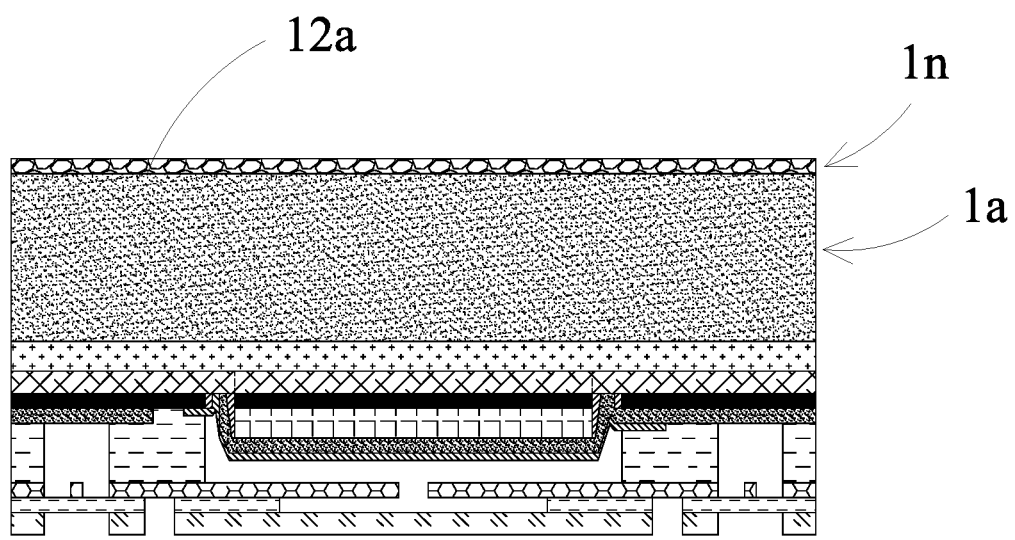
Figure 2Y:
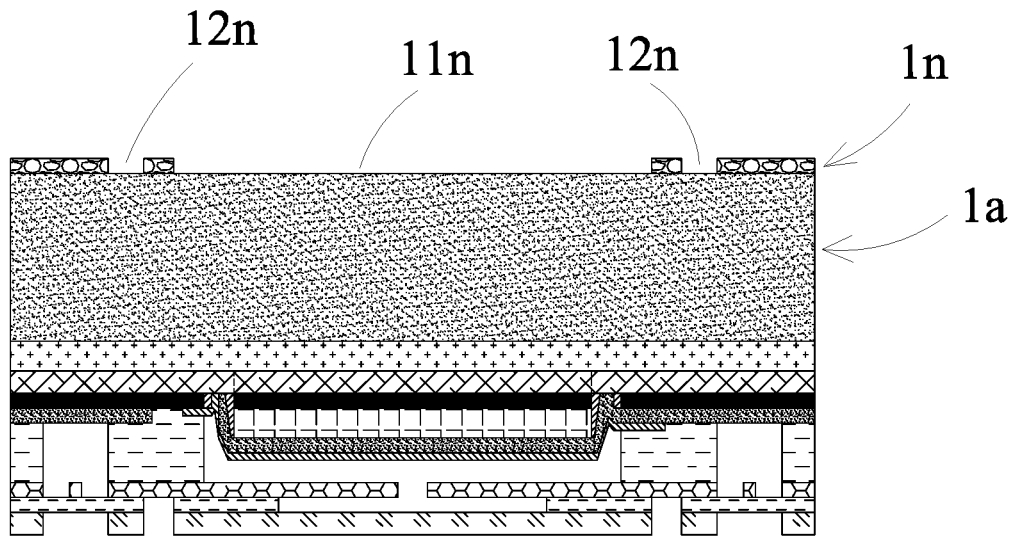
Figure 2Z:
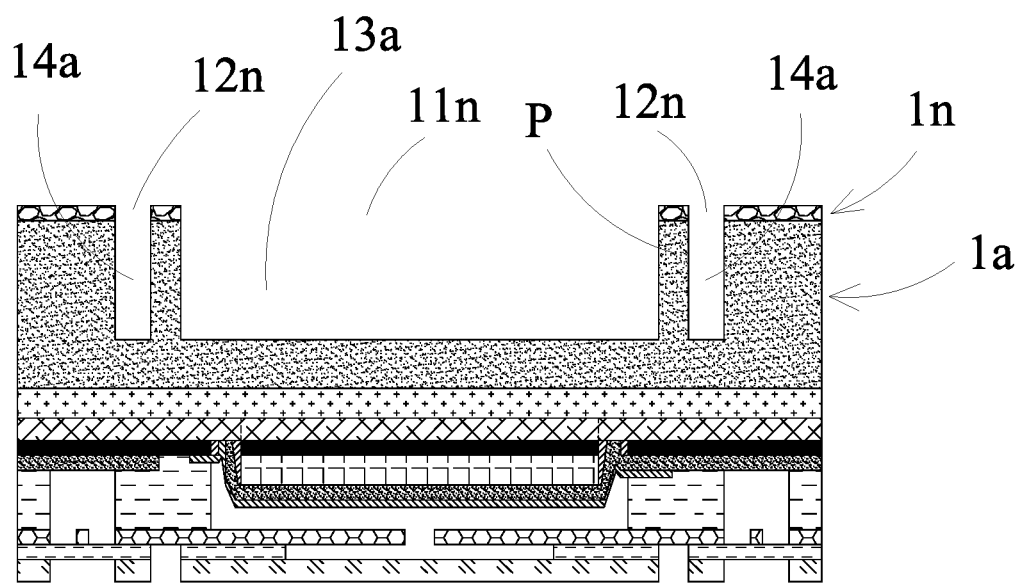
Figure 2A:
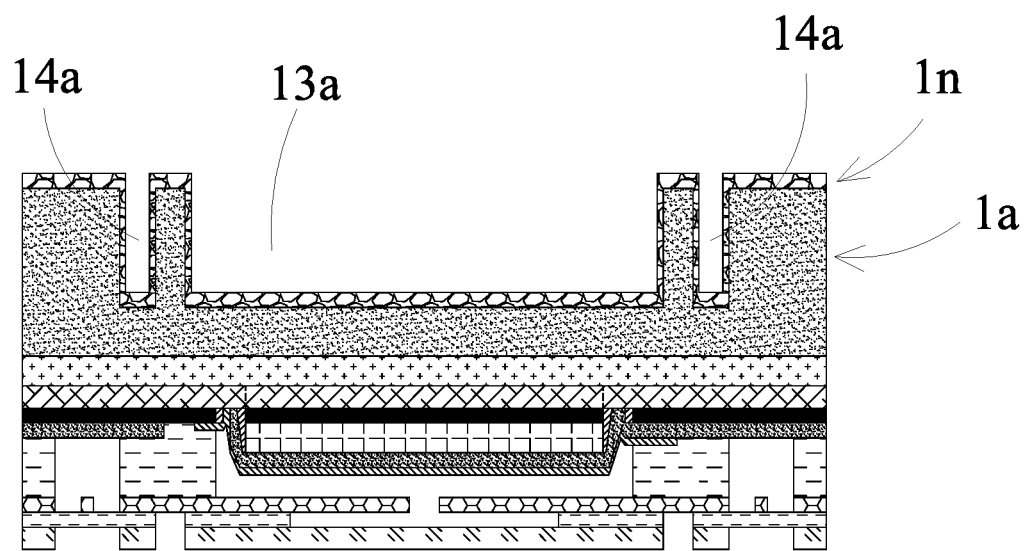
Figure 2A:
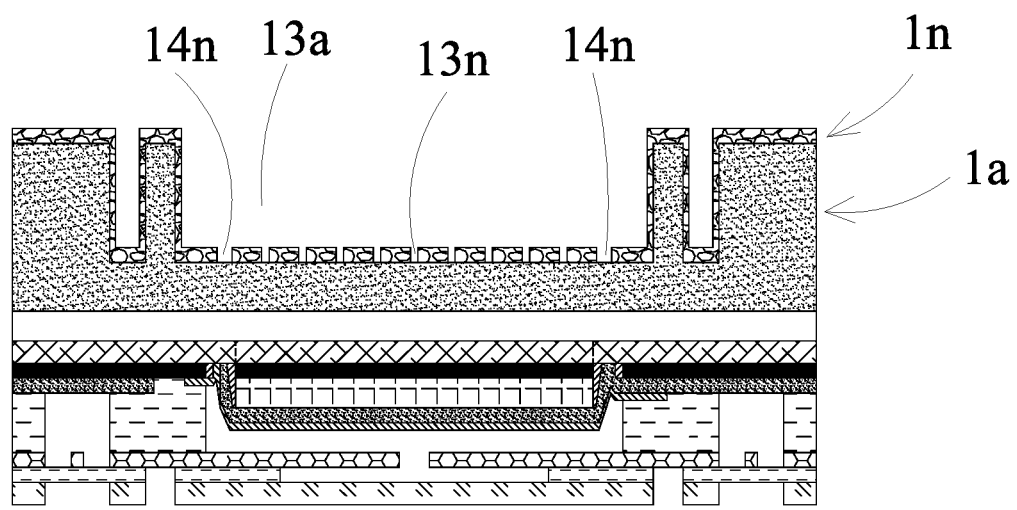
Figure 2A:
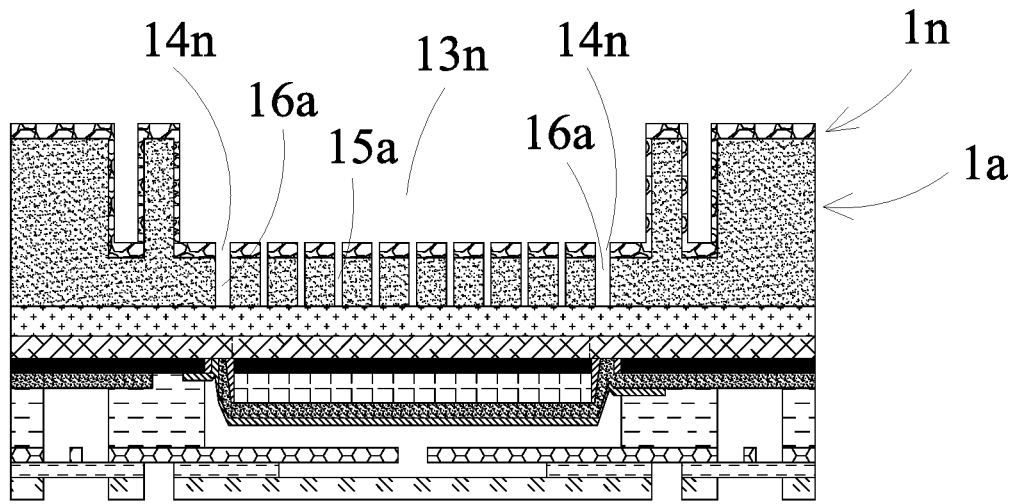
Figure 2A:
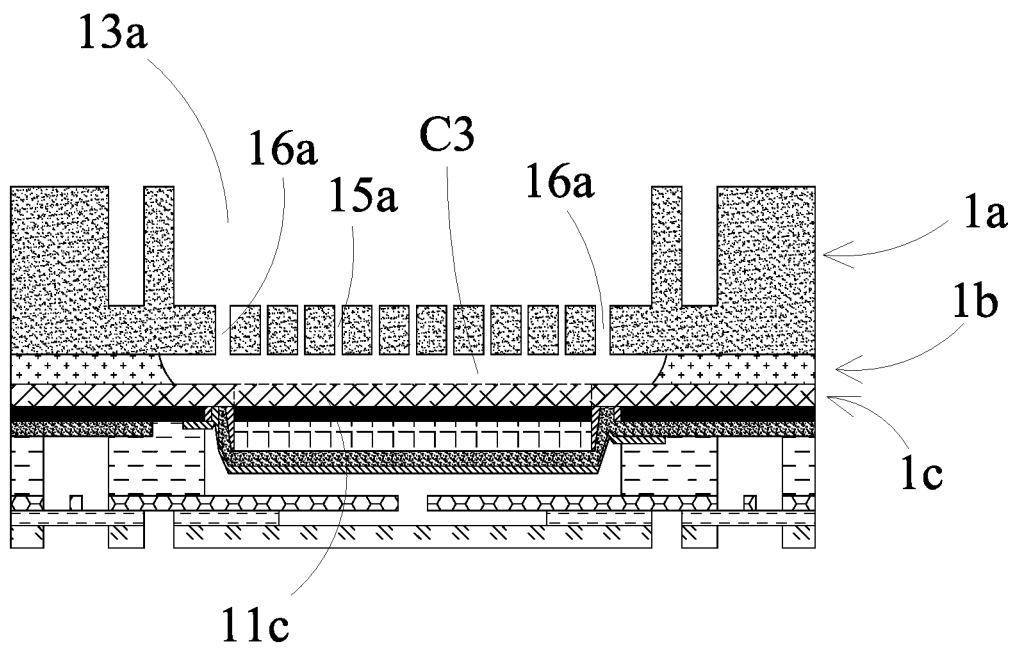
Figure 2A:
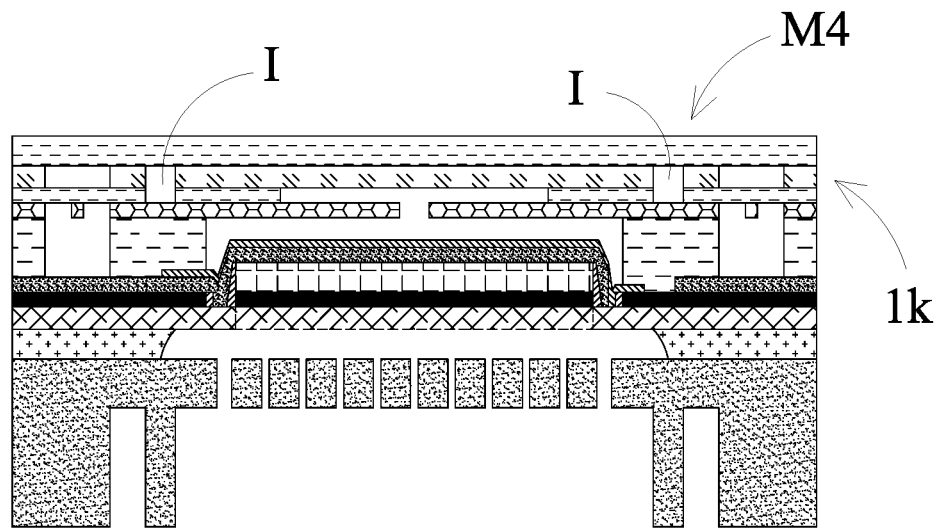
Figure 2A:
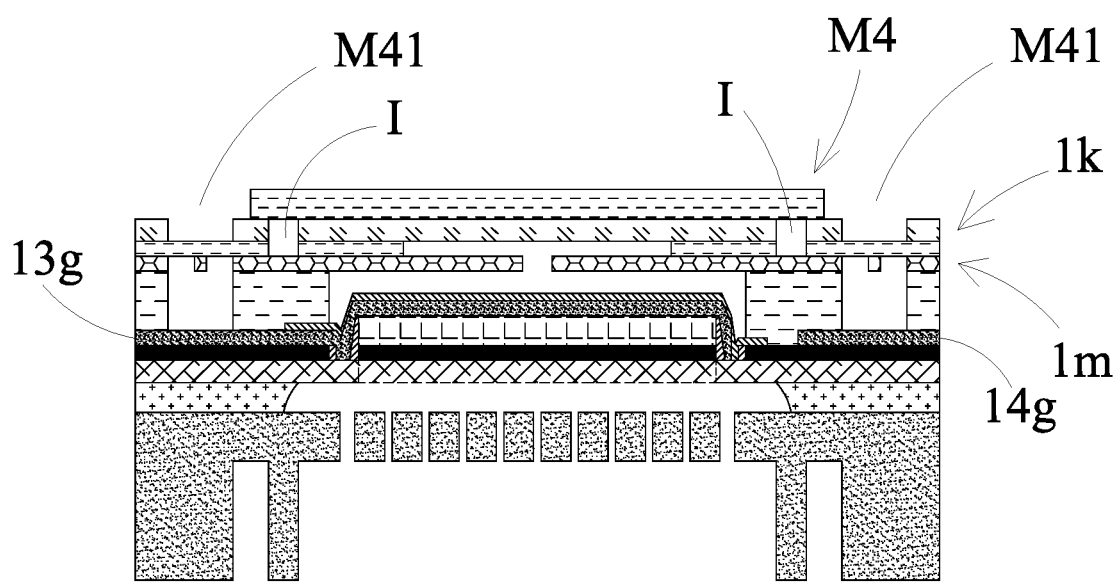
Figure 2A:
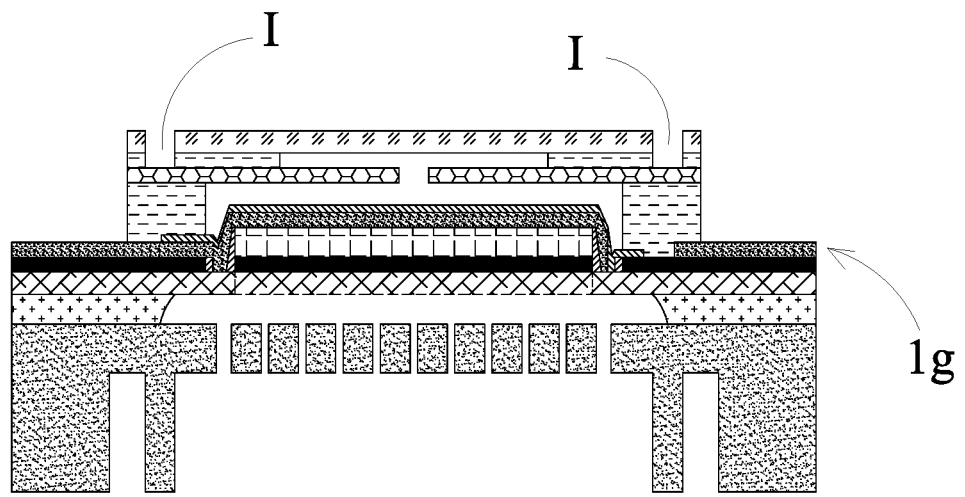
Figure 2A:
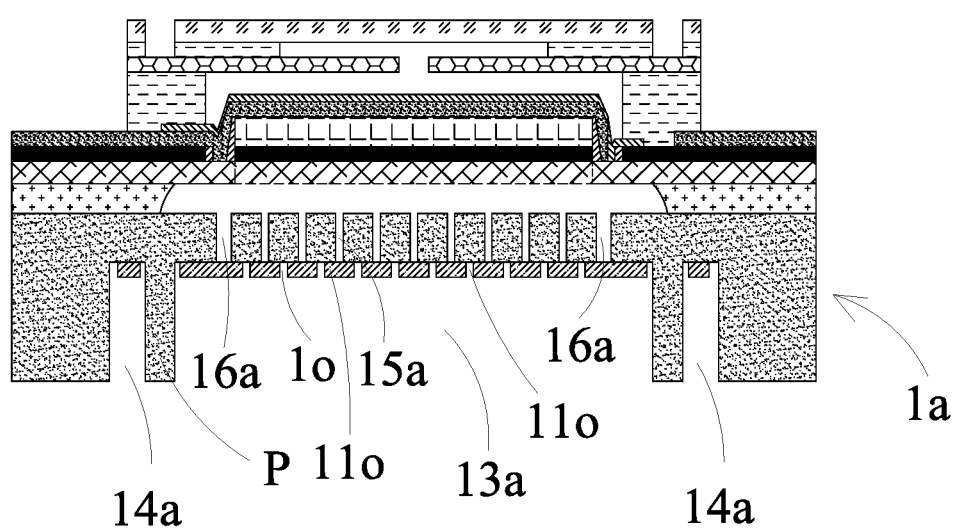

Please refer to FIGS. 2X to 2Z. In the first embodiment of the present disclosure, the mask layer 1n is formed on the second surface 12a of the first substrate 1a by a deposition process that deposits silicon dioxide material. A mask aperture 11n and a plurality of mask through holes 12n are formed by an etching process, and the first substrate 1a is thereby exposed. An etching process is performed on the second surface 12a of the first substrate 1a corresponding in positions to the mask aperture 11n and the mask through holes 12n to form an outlet groove 13a and a plurality of auxiliary grooves 14a. The outlet groove 13a and the auxiliary grooves 14a have the same etching depth, and the etching end is located between the first surface 11a and the second surface 12a but not in contact with the chamber layer 1b. The plurality of auxiliary grooves 14a are symmetrically disposed on the two opposite sides of the outlet groove 13a. A positioning pillar P is formed between each auxiliary groove 14a and the outlet groove 13a.

Please refer to FIGS. 2AA and 2AB. In the first embodiment of the present disclosure, the mask layer 1n is formed within the outlet groove 13a and the auxiliary grooves 14a of the first substrate 1a by a deposition process that deposits silicon dioxide material. A plurality of first mask through holes 13n and a plurality of second mask through holes 14n are formed within the outlet groove 13a by a precise drilling process. The plurality of second mask through holes 14n are symmetrically disposed outside the plurality of first mask through holes 13n. In the first embodiment of the present disclosure, the aperture size of each first mask through hole 13n is smaller than that of each second mask through hole 14n, but the present disclosure is not limited thereto. The drilling process forming the first mask through holes 13n and the second mask through holes 14n is stopped until contacting the first substrate 1a, thereby exposing the first substrate 1a. In the first embodiment of the present disclosure, the precise drilling process is an excimer laser machining process, but the present disclosure is not limited thereto.

Please refer to FIGS. 2AC, 2AD and 5. In the first embodiment of the present disclosure, a low temperature deep etching process is performed to the first substrate 1a corresponding in positions to the first mask through holes 13n and the second mask through holes 14n to form a plurality of first outflow apertures 15a and a plurality of second outflow apertures 16a. The plurality of first outflow apertures 15a are respectively formed by performing an etching process from the plurality of first mask through holes 13n until contacting the chamber layer 1b. The plurality of second outflow apertures 16a are respectively formed by performing the etching process from the plurality of second mask through holes 14n until contacting the chamber layer 1b. Consequently, the plurality of second outflow apertures 16a are disposed on outer sides of the plurality of first outflow apertures 15a, and the aperture size of each second outflow aperture 16a is greater than that of each first outflow aperture 15a. In the first embodiment of the present disclosure, the low temperature etching process is deep reactive ion etching process, i.e. BOSCH process, but the present disclosure is not limited thereto. In the first embodiment of the present disclosure, the cross section of each first outflow aperture 15a and the cross section of each second outflow aperture 16a are rectangular, but the present disclosure is not limited thereto.

It is noted that, in the first embodiment of the present disclosure, an excimer laser machining process is performed to the mask layer 1n to form the first mask through holes 13n and the second mask through holes 14n, thereby solving the problems, such as the difficulty of photoresist coating and the problem of focusing difficulty when using the contact-type mask during the light exposure. In addition, in the first embodiment of the present disclosure, the deep reactive ion etching process, i.e. BOSCH process, is a low temperature process, so that the high temperature generated during the machining that will affect the distribution of polarity of the piezoelectric material in the downstream manufacturing process and result in depolarization effect can be avoided. Besides, in the first embodiment of the present disclosure, the through holes formed by the deep reactive ion etching process, i.e. BOSCH process, has high aspect ratio, and therefore, the etching depths of the through holes are preferably 100 μm, so that the diameter of the through holes can be less than 10 μm, and the strength of the structure is maintained. In the first embodiment of the present disclosure, the arrangement of the outlet groove 13a enables the position of the through holes formed by the deep reactive ion etching process, i.e. BOSCH process, can be at a lower level.

Please refer to FIG. 2AD. In the first embodiment of the present disclosure, a wet etching process is further performed to the chamber layer 1b to form a storage chamber C3 therewithin. That is, the etching liquid enters from the first mask through holes 13n and the second mask through holes 14n, and flows into the chamber layer 1b through the first outflow apertures 15a and the second outflow apertures 16a, so that a part of the chamber layer 1b is removed and released by the etching liquid so as to define the storage chamber C3. Thus, the storage chamber C3 is in fluid communication with the first outflow apertures 15a and the second outflow apertures 16a. It is noted that, at the same time of forming the storage chamber C3 by the wet etching process, the mask layer 1n is also removed. After the formation of the storage chamber C3 and the removal of the mask layer 1n, the first outflow apertures 15a and the second outflow apertures 16a are in fluid communication with the outlet groove 13a.

It is noted that, in the first embodiment of the present disclosure, because the required distance between the two outer sides of the storage chamber C3 is slightly greater than the distance between the two sides of the outlet groove 13a, the aperture size of each second outflow aperture 16a being greater than that of each first outflow aperture 15a is beneficial to the side etching of the storage chamber C3.

Please refer to FIGS. 2AE to 2AG. In the first embodiment of the present disclosure, the third photoresist layer M4 is formed on the inlet layer 1k by a rolling process. After the third photoresist layer M4 is developed, a plurality of third photoresist openings M41 are formed. The plurality of third photoresist openings M41 are disposed correspondingly in positions to the upper electrode pad 13g and the lower electrode pad 14g. An etching process is performed so that the structures located over the upper electrode pad 13g and the lower electrode pad 14g are removed, and the upper electrode pad 13g and the lower electrode pad 14g are exposed. In the first embodiment of the present disclosure, the third photoresist layer M4 is used as a hard mask dry film photoresist, but the present disclosure is not limited thereto. It is noted that, to avoid the lack of structural support strength of the first substrate 1a after the etching process, the covering of the third photoresist layer M4 can also be performed right after the wafer bonding process of the resonance layer 1m and the second photoresist layer M2 has been done, but the present disclosure is not limited thereto.

Please refer to FIGS. 2AH and 5. In the first embodiment of the present disclosure, the aperture array plate 1o includes a plurality of aperture plate through holes 11o and a plurality of fixing holes 12o, and is attached in the outlet groove 13a of the first substrate 1a and the auxiliary grooves 14a by a sticking process. The plurality of aperture plate through holes 11o are misaligned with the plurality of first outflow apertures 15a and the plurality of second outflow apertures 16a to seal the plurality of first outflow apertures 15a and the plurality of second outflow apertures 16a, so that the aperture array plate 1o is configured as an one-way valve that can avoid the backflow phenomena during the fluid transportation. The plurality of positioning pillars P of the first substrate 1a respectively penetrate the plurality of fixing holes 12o. In the first embodiment of the present disclosure, the arrangements of the plurality of positioning pillars P of the first substrate 1a make it possible to stick the aperture array plate 1o manually and fix the aperture array plate 1o with an adhesive manner. In some embodiments, the alignment of the aperture array plate 1o can be performed by an automatic optical alignment manner so that the distribution densities of the aperture plate through hole 11o of the aperture array plate 1o and the first outflow aperture 15a and the second outflow aperture 16a of the first substrate 1a, can be increased. In the first embodiment of the present disclosure, the aperture size of each fixing hole 12o is greater than that of each positioning pillar P with an amount of 50 μm, but the present disclosure is not limited thereto. In the first embodiment of the present disclosure, the aperture array plate 1o is made of polyimide (PI) material, but the present disclosure is not limited thereto. In the first embodiment of the present disclosure, the aperture array plate 1o includes two fixing holes 12o, in other embodiments, the number of the fixing hole 12o can be varied according to the practical requirements of design, but the present disclosure is not limited thereto.

Please refer to FIG. 3. It is noted that, in the first embodiment of the present disclosure, the two fluid grooves 11c of the vibration layer 1c are respectively formed on the two opposite sides of the vibration layer 1c in the longitudinal direction so that the vibration layer 1c is supported in the horizontal direction, and a greater deformation amount of the vibration layer 1c in the vertical direction is achieved.

Figure 6A:
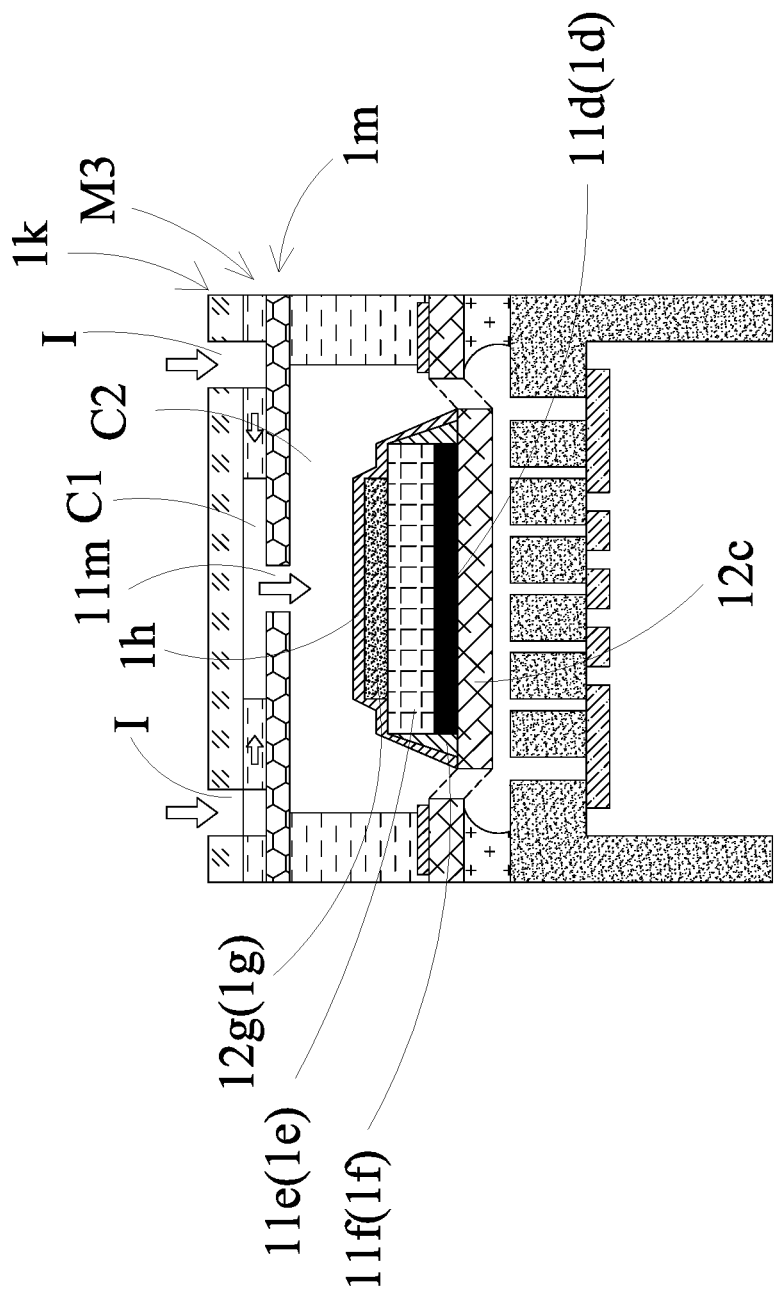
Figure 6B:
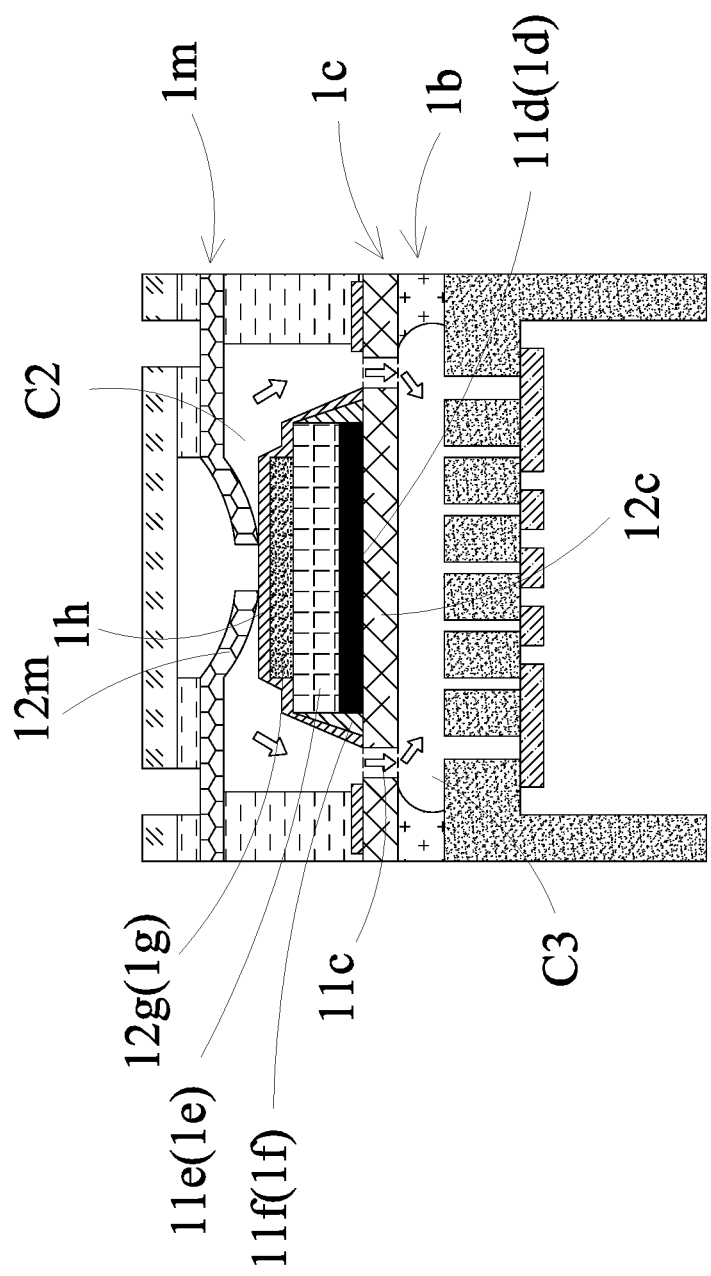
Figure 6C:
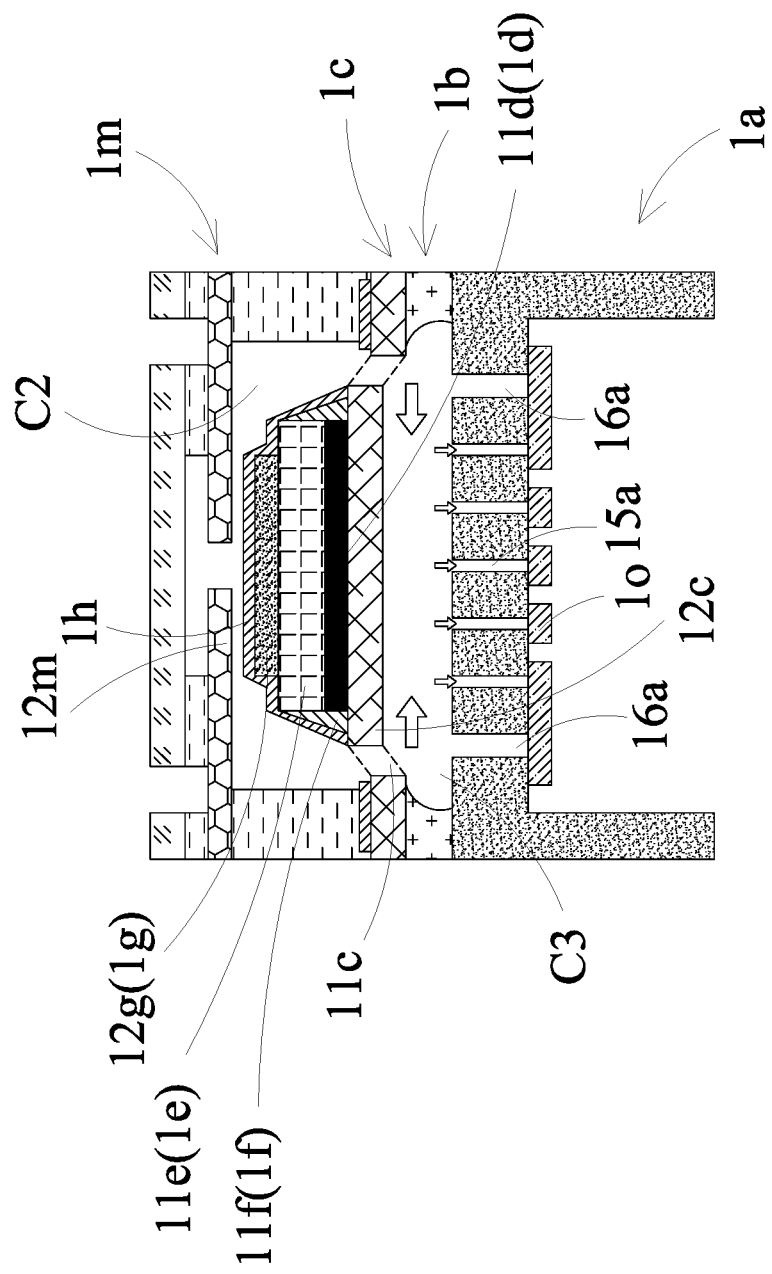
Figure 6D:
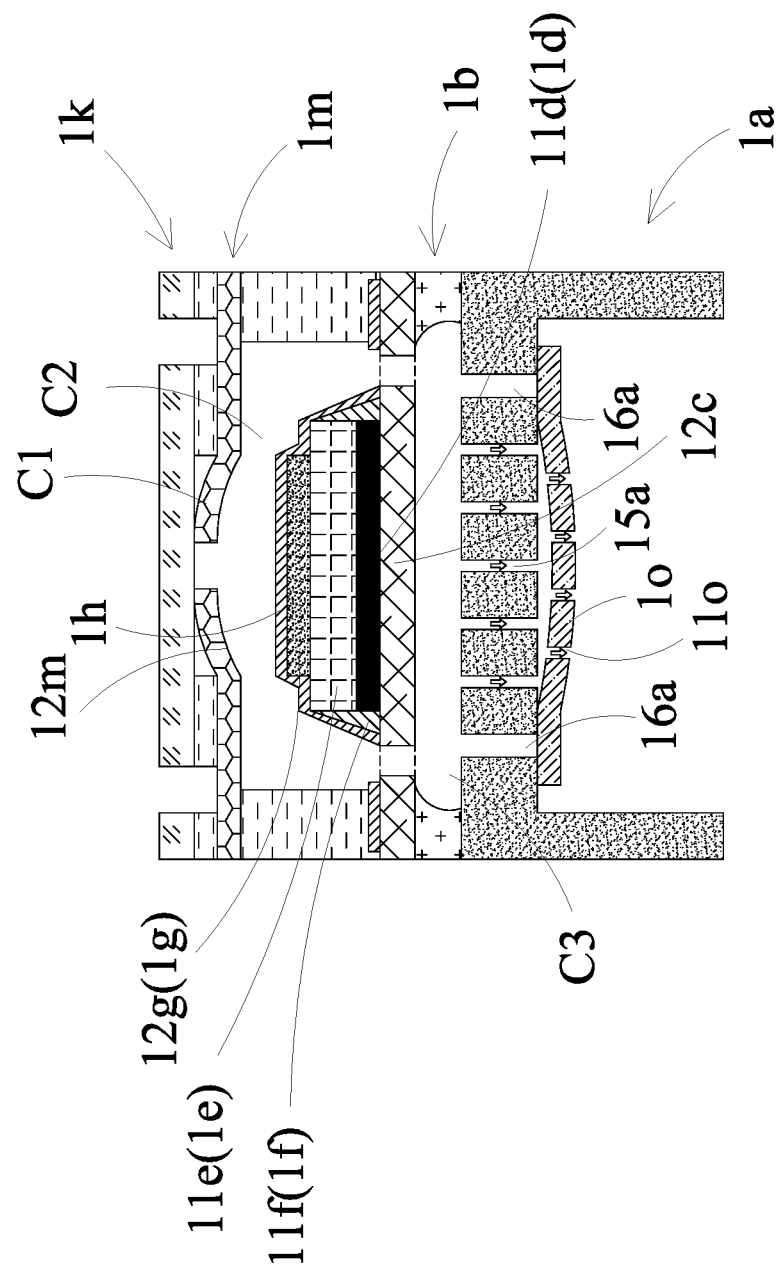

Please refer to FIGS. 1A, 1B and 6A to 6E. In the first embodiment of the present disclosure, the specific operation of the micro fluid actuator 100 is to provide driving power having different phase charges to the upper electrode pad 13g and the lower electrode pad 14g, so as to drive and control the vibration region 12c of the vibration layer 1c to displace in a reciprocating manner. As shown in FIGS. 1A and 6A, when a negative voltage is applied to the upper electrode layer pad 13g and a positive voltage is applied to the lower electrode pad 14g, the actuation region 11e of the piezoelectric actuation layer 1e drives the vibration region 12c of the vibration layer 1c to displace in a direction toward the first substrate 1a. Consequently, the fluid is inhaled from the exterior into the micro fluid actuator 100 through the fluid inlet I, and the fluid inhaled into the micro fluid actuator 100 then sequentially flows through the plurality of fluid channel inlets M31 of the fluid channel layer M3, the plurality of inflow channels M33 and flows into the inflow chamber C1. And then the fluid further flows into the resonance chamber C2 through the chamber through hole 11m of the resonance layer 1m. As shown in FIGS. 1A and 6B, when the voltage is stopped to be applied to the upper electrode pad 13g and the lower electrode pad 14g, the actuation region 11e of the piezoelectric actuation layer 1e drives the vibration region 12c of the vibration layer 1c to return to the unactuated position. Meanwhile, the movable portion 12m of the resonance layer 1m moves in a direction toward the first substrate 1a and attaches on the waterproof layer 1h because of the resonance and causes the chamber through hole 11m of the resonance layer 1m being not in fluid communication with the resonance chamber C2. Thereby, the fluid within the resonance chamber C2 is compressed and flows through the fluid grooves 11c of the vibration layer 1c, and is converged within the storage chamber C3 of the chamber layer 1b. As shown in FIGS. 1A and 6C, subsequently, electrical properties applied to the upper electrode pad 13g and the lower electrode pad 14g are changed. Namely, the positive voltage is applied to the upper electrode pad 13g and the negative voltage is applied to the lower electrode pad 14g, so that the vibration region 12c of the vibration layer 1c is displaced in a direction away from the first substrate 1a. The movable portion 12m of the resonance layer 1m returns back to the position where the resonance displacement is not generated, so that the volume inside the resonance chamber C2 is compressed by the vibration layer 1c and causes the fluid converged within the storage chamber C3 starts to flows into the first outflow apertures 15a and the second outflow apertures 16a. As shown in FIGS. 1A and 6D, when the voltage is stopped to be applied to the upper electrode pad 13g and the lower electrode pad 14g again, the actuation region 11e of the piezoelectric actuation layer 1e drives the vibration region 12c of the vibration layer 1c to return to the unactuated position. Meanwhile, the movable portion 12m of the resonance layer 1m moves in a direction away from the first substrate 1a and attaches on the inlet layer 1k because of the resonance and causes the chamber through hole 11m of the resonance layer 1m being not in fluid communication with the inflow chamber C1. Thereby, the fluid converged within the storage chamber C3 is compressed and starts to flow out through the first outflow apertures 15a and the second outflow apertures 16a, and then pushes out the aperture array plate 1o. As shown in FIGS. 1A and 6E, when the movable portion 12m of the resonance layer 1m stops to resonance and return to the position where the resonance displacement is not generated, the fluid is discharged out from the micro fluid actuator 100 through the aperture plate through holes 11o of the aperture array plate 1o to achieve fluid transportation.

Figure 7A:
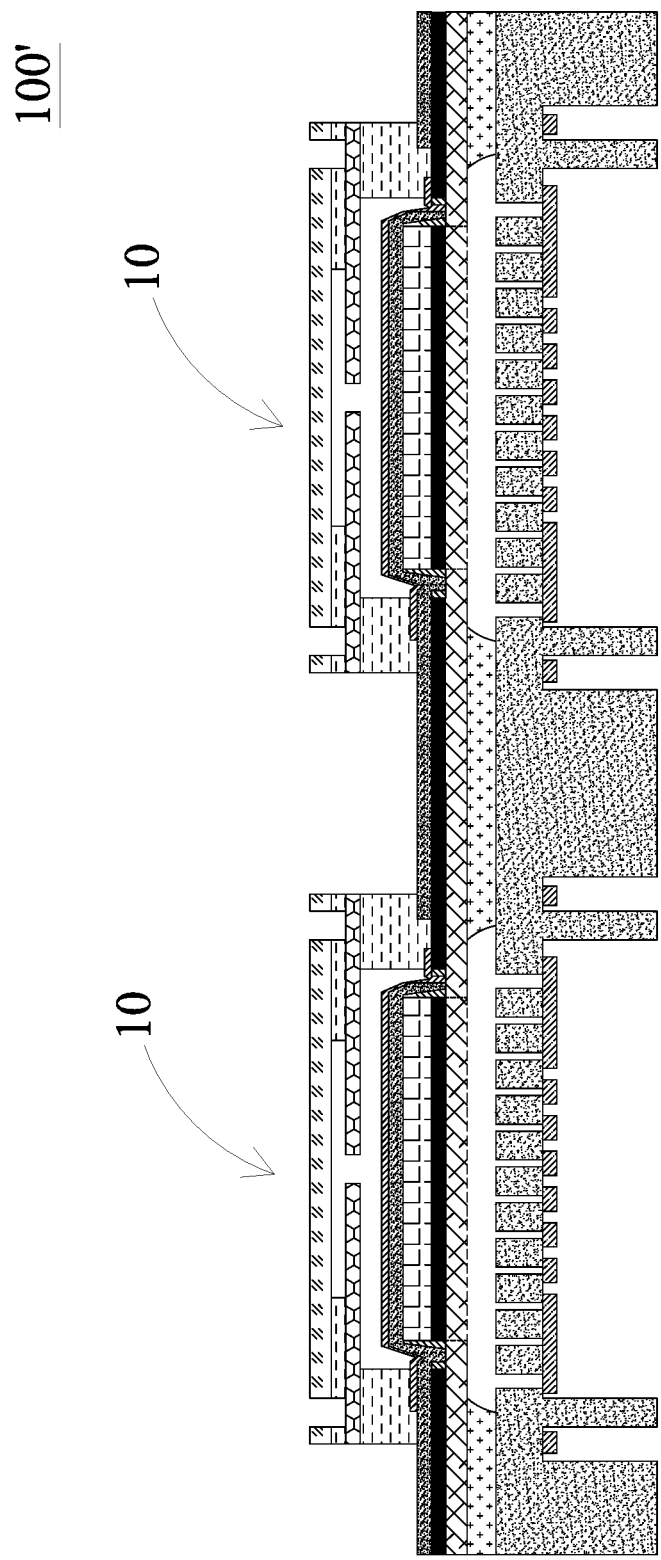
FIG. 7A is cross sectional view illustrating a micro fluid actuator according to a second embodiment of the present disclosure.

Please refer to FIG. 7A. The second embodiment is similar to the first embodiment in the present disclosure. The difference therebetween is that the micro fluid actuator 100' includes two actuation units 10 to increase the fluid transportation amount.

Figure 7B:
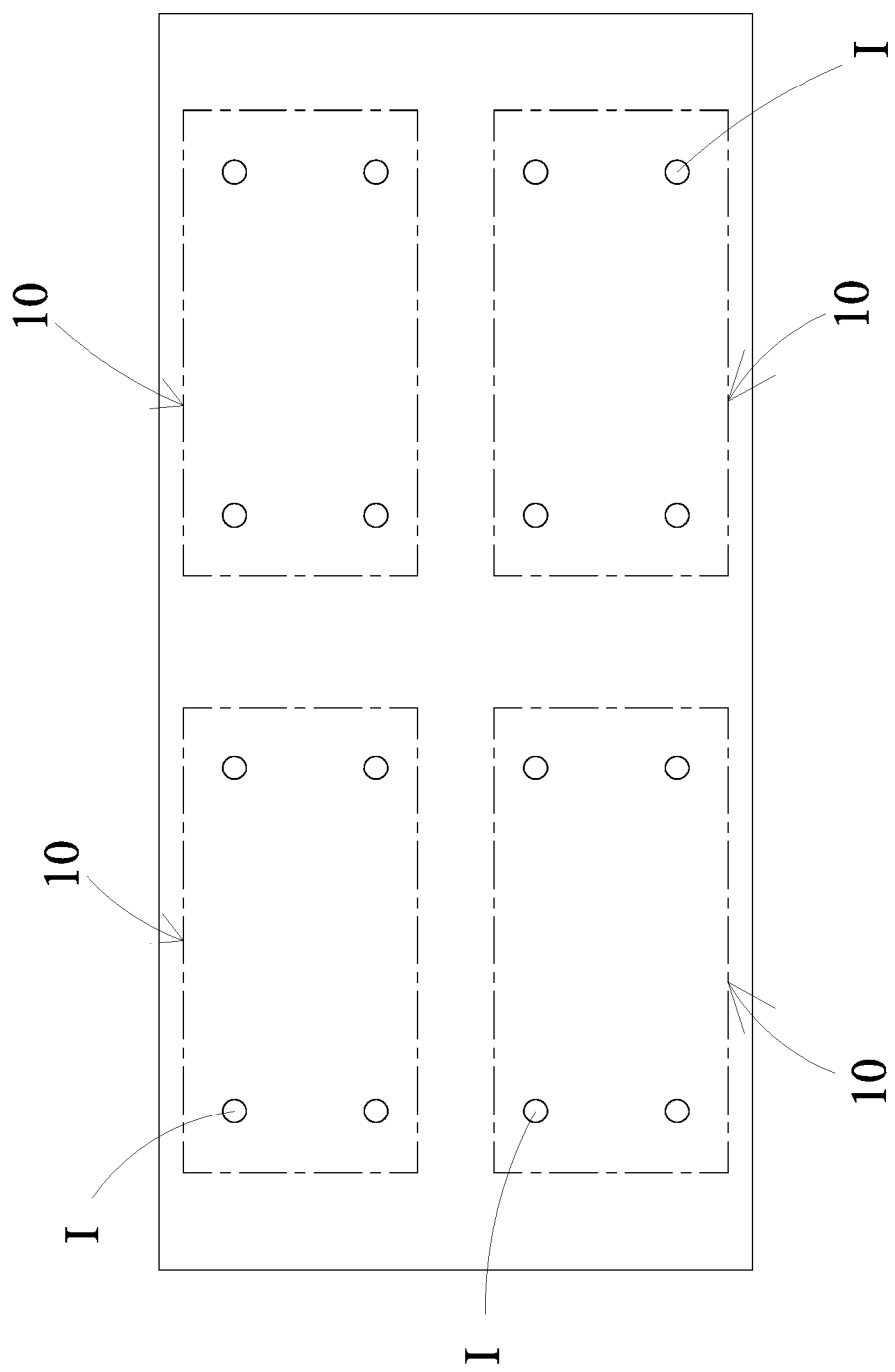
FIG. 7B is a bottom schematic view illustrating a micro fluid actuator according to another embodiment of the present disclosure.

Please refer to FIG. 7B. In some embodiments, the micro fluid actuator 100" includes a plurality of actuation units 10. The plurality of actuation units 10 may be connected in series, in parallel or in series-parallel manner to increase the fluid transportation amount. However, the arrangements of the actuation units 10 can be varied according to the practical requirements, and it is not limited thereto.

Figure 8:
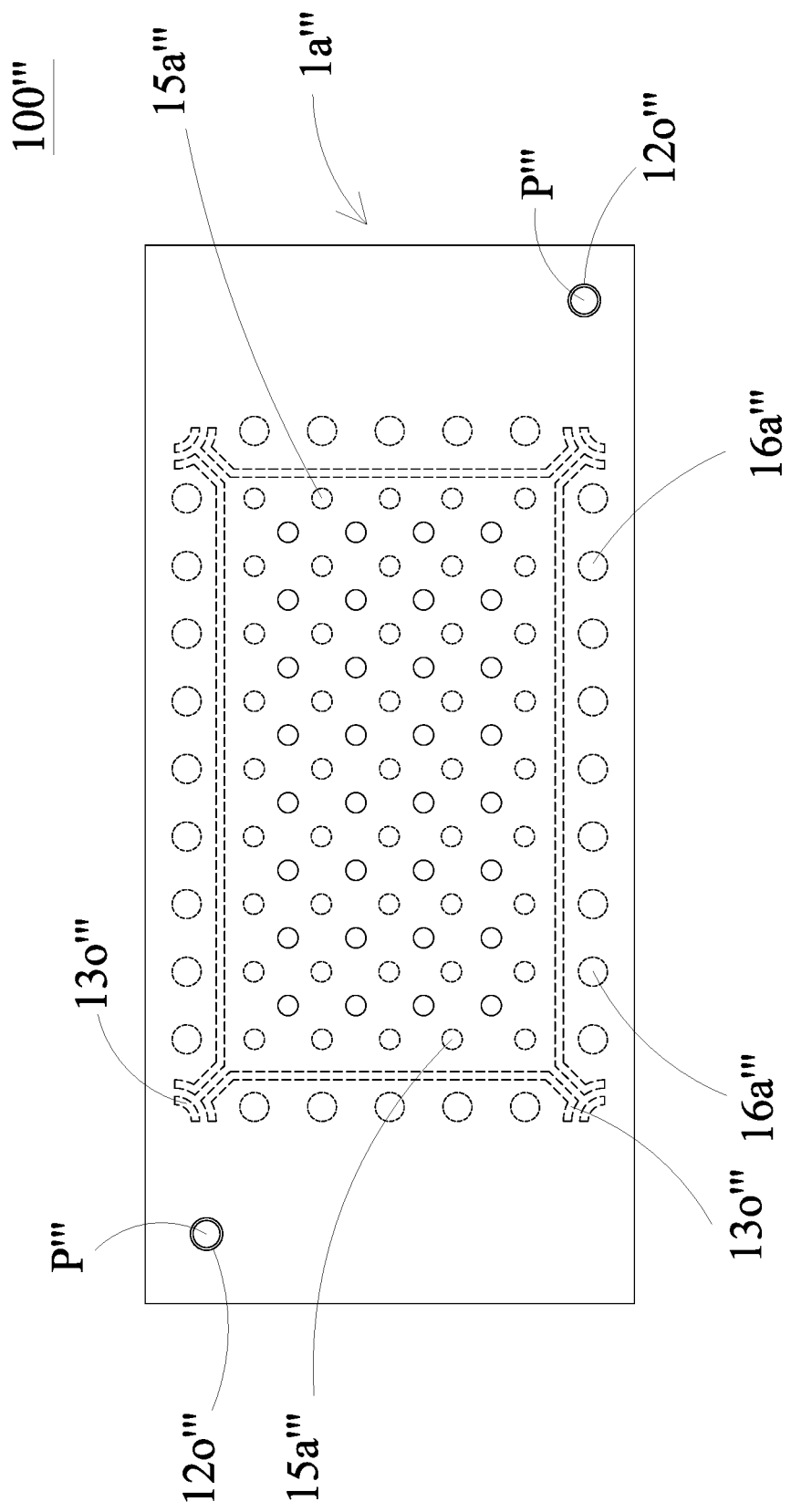
FIG. 8 is a bottom schematic view illustrating an aperture array plate according to a third embodiment of the present disclosure.

Please refer to FIG. 8. The third embodiment is similar to the first embodiment in the present disclosure. The difference therebetween is that the positioning pillars P''' of the micro fluid actuator 100''' and the fixing holes 12o''' of the aperture array plate 1o''' are symmetrically disposed on the corresponding corners of the first substrate 1a'''. The cross section of each first outflow aperture 15a''' and the cross section of each second outflow aperture 16a''' are circular. Besides, the aperture array plate 1o''' includes a supporting portion 13o''' used for increasing the stretch amount of the aperture array plate 1o''' to achieve the effect like a spring. In the third embodiment of the present disclosure, the aperture array plate 1o''' may be used for filtering the impurities in the fluid to increase the durabilities and reliabilities of the elements within the micro fluid actuator 100'''.

Please refer to FIGS. 9A to 9C. The fourth embodiment is similar to the first embodiment in the present disclosure. The difference therebetween is that the flip alignment process and the wafer bonding process are different. Because of the huge difference of the heat conductivities between the first substrate 1a and the second substrate 1i, and it is prone to have problems of thermal stress and void in the wafer bonding process, it is prefer to form the first substrate 1a, the chamber layer 1b, the vibration layer 1c, the first metal layer 1d, the piezoelectric actuation layer 1e, the separation layer 1f, the second metal layer 1g, the waterproof layer 1h, the second photoresist layer M2 and the resonance layer 1m as a semi-product first. Then, perform the rolling process and the development process on the inlet layer 1k to form the fluid channel layer M3. Finally, flip the inlet layer 1k and the fluid channel layer M3 in a flip-chip manner so as to perform an optical two-surface joint process to join the inlet layer 1k and the fluid channel layer M3 with the above-mentioned semi-product. Besides, to reduce the crack possibility of the first substrate 1a after the etching process, an active treatment can be performed on the joining surface so as to reduce the pressure during hot pressuring. In the fourth embodiment of the present disclosure, the inlet layer 1k is made of electroforming material or stainless steel material to improve the rigidity thereof, but the present disclosure is not limited thereto.

In summary, the present disclosure provides a micro fluid actuator. The micro fluid actuator is mainly manufactured by a micro-electromechanical system (MEMS) process. By providing driving power which has different phases to the upper electrode pad and the lower electrode pad, the vibration region of the vibration layer is driven to displace in a reciprocating manner, so as to achieve fluid transportation. Besides, by attaching an aperture array plate on the outflow apertures to serve as a one-way valve, the backflow phenomena is prevented. It is extremely valuable for the use of the industry, and it is submitted in accordance with the law.

While the disclosure has been described in terms of what is presently considered to be the most practical and preferred embodiments, it is to be understood that the disclosure needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A micro fluid actuator comprising:
    a substrate having a first surface, a second surface, an outlet groove, a plurality of first outflow apertures and a plurality of second outflow apertures, wherein the outlet groove, the plurality of first outflow apertures and the plurality of second outflow apertures are formed by an etching process, the outlet groove is in fluid communication with the plurality of first outflow apertures and the plurality of second outflow apertures, and the plurality of second outflow apertures are disposed on outer side of the plurality of first outflow apertures;
    a chamber layer formed on the first surface of the substrate by a deposition process, and etched to form a storage chamber, wherein the storage chamber is in fluid communication with the plurality of first outflow apertures and the plurality of second outflow apertures;
    a vibration layer formed on the chamber layer by the deposition process, and etched to form a plurality of fluid grooves and a vibration region, wherein the plurality of fluid grooves are symmetrically formed on two opposite sides of the vibration layer, and the vibration region is thereby defined;
    a first metal layer formed on the vibration layer by the deposition process, and etched to form a lower electrode region, a plurality of barrier regions and a plurality of gaps, wherein the lower electrode region is formed correspondingly in position to the vibration region, the plurality of gaps are formed between the lower electrode region and the plurality of barrier regions, and the plurality of barrier regions are formed corresponding in outside positions to the plurality of fluid grooves;
    a piezoelectric actuation layer formed on the first metal layer by the deposition process, and etched to form an actuation region corresponding in position to the lower electrode region of the first metal layer;
    a separation layer formed on the piezoelectric actuation layer and the first metal layer by the deposition process, and etched to form a plurality of gap walls within the plurality of gaps;
    a second metal layer formed on the piezoelectric actuation layer, the first metal layer and the separation layer by the deposition process, and etched to form an upper electrode pad and a lower electrode pad on the first metal layer;
    a waterproof layer formed on the first metal layer, the second metal layer and the separation layer by a coating process, and etched to expose the upper electrode pad and the lower electrode pad;
    a photoresist layer formed on the first metal layer, the second metal layer and the waterproof layer after development;
    an inlet layer forming a plurality of fluid inlets thereon by the etching process or a laser process;
    a fluid channel layer formed on the inlet layer, and having an inflow chamber, a plurality of inflow channels and a plurality of fluid channel inlets formed by a photolithography process, wherein the plurality of fluid channel inlets are respectively in fluid communication with the plurality of fluid inlets of the inlet layer, the plurality of inflow channels and the plurality of fluid channel inlets are disposed around the surrounding of the inflow chamber, and the plurality of inflow channels are in fluid communication between the plurality of fluid channel inlets and the inflow chamber;
    a resonance layer formed on the fluid channel layer by a rolling process, forming a chamber through hole thereon by the etching process, wherein the resonance layer joins the photoresist layer by a flip alignment process and a wafer bonding process; and
    an aperture array plate formed on the substrate by a sticking process and comprising a plurality of aperture plate through holes, wherein the plurality of aperture plate through holes are misaligned with the plurality of first outflow apertures and the plurality of second outflow apertures, thereby sealing the plurality of first outflow apertures and the plurality of second outflow aperture of the substrate, wherein as driving power having different phase charges is provided to the upper electrode pad and the lower electrode pad to drive and control the vibration region of the vibration layer to displace in a reciprocating manner, the fluid is inhaled from the plurality of fluid inlets, flows into the inflow chamber through the plurality of inflow channels, flows into the resonance chamber through the chamber through hole, flows into the storage chamber through the plurality of fluid grooves, is compressed to flow through the plurality of first outflow apertures and the plurality of second outflow apertures, pushes out the aperture array plate, and then is discharged out from the plurality of aperture plate through holes to achieve fluid transportation.

2. The micro fluid actuator according to claim 1, wherein the upper electrode pad and the lower electrode pad are respectively formed on two opposite sides of the piezoelectric actuation layer.

3. The micro fluid actuator according to claim 1, wherein each of the second outflow apertures has an aperture size greater than that of each of the first outflow apertures.

4. The micro fluid actuator according to claim 1, wherein the substrate is etched to form a plurality of auxiliary grooves by the etching process, the plurality of auxiliary grooves are symmetrically formed on two opposite sides of the outlet groove, and thereby a positioning pillar is formed between the outlet groove and each auxiliary groove, wherein the positioning pillar is used to position the aperture array plate.

5. The micro fluid actuator according to claim 1, wherein the substrate is made of silicon material.

6. The micro fluid actuator according to claim 1, wherein the chamber layer is made of silicon dioxide material.

7. The micro fluid actuator according to claim 1, wherein the vibration layer is made of silicon mononitride material.

8. The micro fluid actuator according to claim 1, wherein the first metal layer is made of titanium nitride material or tantalum material.

9. The micro fluid actuator according to claim 1, wherein the separation layer is made of silicon dioxide material.

10. The micro fluid actuator according to claim 1, wherein the second metal layer is made of gold material or aluminum material.

11. The micro fluid actuator according to claim 1, wherein the substrate is etched to form the plurality of first outflow apertures and the plurality of second outflow apertures by a deep reactive ion etching process.

12. The micro fluid actuator according to claim 1, wherein the chamber layer is etched to form the storage chamber by a wet etching process.

13. The micro fluid actuator according to claim 1, wherein the photoresist layer is a thick-film photoresist.

14. The micro fluid actuator according to claim 1, wherein the resonance layer is etched to form the chamber through hole by a dry etching process.

15. The micro fluid actuator according to claim 1, wherein the resonance layer is etched to form the chamber through hole by a laser etching process.

16. The micro fluid actuator according to claim 1, wherein when a positive voltage is applied to the upper electrode pad and a negative voltage is applied to the lower electrode pad, the actuation region of the piezoelectric actuation layer drives the vibration region of the vibration layer to displace in a direction away from the substrate.

17. The micro fluid actuator according to claim 1, wherein when a negative voltage is applied to the upper electrode pad and a positive voltage is applied to the lower electrode pad, the actuation region of the piezoelectric actuation layer drives the vibration region of the vibration layer to displace in a direction toward the substrate.

18. The micro fluid actuator according to claim 1, wherein:
as a negative voltage is applied to the upper electrode pad and a positive voltage is applied to the lower electrode pad, the actuation region of the piezoelectric actuation layer drives and controls the vibration layer to displace in a direction toward the substrate, so that the fluid is inhaled from the exterior into the micro fluid actuator through the plurality of fluid inlets, the fluid in the micro fluid actuator flows into the inflow chamber through the plurality of the inflow channels, flows into the resonance chamber through the chamber through hole, and is then converged in the storage chamber through the plurality of fluid grooves, and as the electrical properties of the upper electrode pad and the lower electrode pad are changed to apply the positive voltage to the upper electrode pad and the negative voltage to the lower electrode pad, the piezoelectric actuation layer drives and controls the vibration layer to displace in a direction away from the substrate, so that the fluid converged in the storage chamber sequentially flows through the plurality of first outflow apertures and the second outflow apertures and is discharged out of the micro fluid actuator from the plurality of aperture plate through holes to achieve fluid transportation.

19. A micro fluid actuator comprising a plurality of actuating units, each actuating unit comprising: a substrate having a first surface, a second surface, an outlet groove, a plurality of first outflow apertures and a plurality of second outflow apertures, wherein the outlet groove, the plurality of first outflow apertures and the plurality of second outflow apertures are formed by an etching process, the outlet groove is in fluid communication with the plurality of first outflow apertures and the plurality of second outflow apertures, and the plurality of second outflow apertures are disposed in outer side of the plurality of first outflow apertures; a chamber layer formed on the first surface of the substrate by a deposition process, and etched to form a storage chamber, wherein the storage chamber is in fluid communication with the plurality of first outflow apertures and the plurality of second outflow apertures; a vibration layer formed on the chamber layer by the deposition process, and etched to form a plurality of fluid grooves and a vibration region, wherein the plurality of fluid grooves are symmetrically formed on two opposite sides of the vibration layer, and the vibration region is thereby defined; a first metal layer formed on the vibration layer by the deposition process, and etched to form a lower electrode region, a plurality of barrier regions and a plurality of gaps, wherein the lower electrode region is formed correspondingly in position to the vibration region, the plurality of gaps are formed between the lower electrode region and the plurality of barrier regions, and the plurality of barrier regions are formed corresponding in outside positions to the plurality of fluid grooves; a piezoelectric actuation layer formed on the first metal layer by the deposition process, and etched to form an actuation region corresponding in position to the lower electrode region of the first metal layer; a separation layer formed on the piezoelectric actuation layer and the first metal layer by the deposition process, and etched to form a plurality of gap walls within the plurality of gaps; a second metal layer formed on the piezoelectric actuation layer, the first metal layer and the separation layer by the deposition process, and etched to form an upper electrode pad and a lower electrode pad on the first metal layer; a waterproof layer formed on the first metal layer, the second metal layer and the separation layer by a coating process, and etched to expose the upper electrode pad and the lower electrode pad; a photoresist layer formed on the first metal layer, the second metal layer and the waterproof layer after development; an inlet layer forming a plurality of fluid inlets thereon by the etching process or a laser process; a fluid channel layer formed on the inlet layer, and having an inflow chamber, a plurality of inflow channels and a plurality of fluid channel inlets formed by a photolithography process, wherein the plurality of fluid channel inlets are respectively in fluid communication with the plurality of fluid inlets of the inlet layer, the plurality of inflow channels and the plurality of fluid channel inlets are disposed around the surrounding of the inflow chamber, and the plurality of inflow channels are in fluid communication between the plurality of fluid channel inlets and the inflow chamber; a resonance layer formed on the fluid channel layer by a rolling process, forming a chamber through hole thereon by the etching process, wherein the resonance layer joins the photoresist layer by a flip alignment process and a wafer bonding process; and an aperture array plate formed on the substrate by a sticking process and comprising a plurality of aperture plate through holes, wherein the plurality of aperture plate through holes are misaligned with the plurality of first outflow apertures and the plurality of second outflow apertures, thereby sealing the plurality of first outflow apertures and the plurality of second outflow aperture of the substrate, wherein as driving power having different phase charges is provided to the upper electrode pad and the lower electrode pad to drive and control the vibration region of the vibration layer to displace in a reciprocating manner, the fluid is inhaled from the plurality of fluid inlets, flows into the inflow chamber through the plurality of inflow channels, flows into the resonance chamber through the chamber through hole, flows into the storage chamber through the plurality of fluid grooves, is compressed to flow through the plurality of first outflow apertures and the plurality of second outflow apertures, pushes out the aperture array plate, and then is discharged out from the plurality of aperture plate through holes to achieve fluid transportation, wherein the plurality of actuating units are connected in series or in parallel to increase the fluid transportation amount.

20. A micro fluid actuator comprising:
a substrate having a first surface, a second surface, at least one outlet groove, a plurality of first outflow apertures and a plurality of second outflow apertures, wherein the at least one outlet groove, the plurality of first outflow apertures and the plurality of second outflow apertures are formed by an etching process, and the at least one outlet groove is in fluid communication with the plurality of first outflow apertures and the plurality of second outflow apertures;
a chamber layer formed on the first surface of the substrate by a deposition process, and etched to form at least one storage chamber, wherein the at least one storage chamber is in fluid communication with the plurality of first outflow apertures and the plurality of second outflow apertures;
a vibration layer formed on the chamber layer by the deposition process, and etched to form a plurality of fluid grooves and at least one vibration region, wherein the plurality of fluid grooves are symmetrically formed on two opposite sides of the vibration layer and the at least one vibration region is thereby defined;
a first metal layer formed on the vibration layer by the deposition process, and etched to form at least one lower electrode region, a plurality of barrier regions and a plurality of gaps, wherein the at least one lower electrode region is formed correspondingly in position to the at least one vibration region, and the plurality of gaps are formed between the at least one lower electrode region and the plurality of barrier regions;
a piezoelectric actuation layer formed on the first metal layer by the deposition process, and etched to form at least one actuation region correspondingly in position to the at least one lower electrode region of the first metal layer;
a separation layer formed on the piezoelectric actuation layer and the first metal layer by the deposition process, and etched to form a plurality of gap walls within the plurality of gaps;
a second metal layer formed on the piezoelectric actuation layer, the first metal layer and the separation layer by the deposition process, and etched to form at least one upper electrode pad and at least one lower electrode pad on the first metal layer;
a waterproof layer formed on the first metal layer, the second metal layer and the separation layer by a coating process, and etched to expose the at least one upper electrode pad and the at least one lower electrode pad;
a photoresist layer formed on the first metal layer, the second metal layer and the waterproof layer after development;
an inlet layer forming a plurality of fluid inlets thereon by the etching process or a laser process;
a fluid channel layer formed on the inlet layer, and having at least one inflow chamber, a plurality of inflow channels and a plurality of fluid channel inlets formed by a photolithography process, wherein the plurality of fluid channel inlets are respectively in fluid communication with the plurality of fluid inlets of the inlet layer, the plurality of inflow channels and the plurality of fluid channel inlets are disposed around the surrounding of the at least one inflow chamber, and the plurality of inflow channels are in fluid communication between the plurality of fluid channel inlets and the at least one inflow chamber;
a resonance layer formed on the fluid channel layer by a rolling process, forming at least one chamber through hole thereon by the etching process, wherein the resonance layer joins the photoresist layer by a flip alignment process and a wafer bonding process; and
an aperture array plate formed on the substrate by a sticking process and comprising a plurality of aperture plate through holes, wherein the plurality of aperture plate through holes are misaligned with the plurality of first outflow apertures and the plurality of second outflow apertures, thereby sealing the plurality of first outflow apertures and the plurality of second outflow aperture of the substrate,
wherein as driving power having different phase charges is provided to the at least one upper electrode pad and the at least one lower electrode pad to drive and control the at least one vibration region of the vibration layer to displace in a reciprocating manner, the fluid is inhaled from the plurality of fluid inlets, flows into the at least one inflow chamber through the plurality of inflow channels, flows into the resonance chamber through the at least one chamber through hole, flows into the at least one storage chamber through the plurality of fluid grooves, is compressed to flow through the plurality of first outflow apertures and the plurality of second outflow apertures, pushes out the aperture array plate, and then is discharged out from the plurality of aperture plate through holes to achieve fluid transportation.

* * * * *